(12) United States Patent
Herbert

(10) Patent No.: US 6,992,520 B1
(45) Date of Patent: Jan. 31, 2006

(54) GATE DRIVE METHOD AND APPARATUS FOR REDUCING LOSSES IN THE SWITCHING OF MOSFETS

(76) Inventor: Edward Herbert, 1 Dyer Cemetery Rd., Canton, CT (US) 06019-2029

( * ) Notice: Subject to any disclaimer, the term of this patent is extended or adjusted under 35 U.S.C. 154(b) by 0 days.

(21) Appl. No.: 10/707,774

(22) Filed: Jan. 12, 2004

Related U.S. Application Data

(63) Continuation-in-part of application No. 10/248,438, filed on Jan. 20, 2003, now abandoned.

(60) Provisional application No. 60/319,085, filed on Jan. 22, 2002, provisional application No. 60/429,990, filed on Nov. 27, 2002.

(51) Int. Cl.
*H03K 17/04* (2006.01)
(52) U.S. Cl. .................................. 327/377; 327/427
(58) Field of Classification Search ............. 327/110, 327/374–377, 427, 434
See application file for complete search history.

(56) References Cited

U.S. PATENT DOCUMENTS

| | | | | |
|---|---|---|---|---|
| 3,356,858 A | * | 12/1967 | Wanlass | 326/103 |
| 5,347,169 A | * | 9/1994 | Preslar et al. | 327/110 |
| 6,127,861 A | * | 10/2000 | Lee | 327/112 |
| 6,208,535 B1 | * | 3/2001 | Parks | 363/26 |
| 6,593,622 B2 | * | 7/2003 | Kinzer et al. | 257/341 |

* cited by examiner

*Primary Examiner*—Quan Tra

(57) ABSTRACT

Usually, in power converters, the load on a MOSFET is inductive, and the current cannot change rapidly. The drain current is the upper limit of the Miller current, so that if the gate current is larger than the drain current, the gate capacitance will continue to discharge and there can be no Miller shelf. If a parallel capacitor is used with a MOSFET, once the drain voltage starts to rise, the load current divides, placing a new lower limit on the Miller current. To drive a MOSFET with a gate current that exceeds the drain current, the circuit impedances have to be very low, suggesting a new geometry and packaging arrangement for the MOSFET and gate drive. A compatible gate turn of circuit is also disclosed.

13 Claims, 12 Drawing Sheets

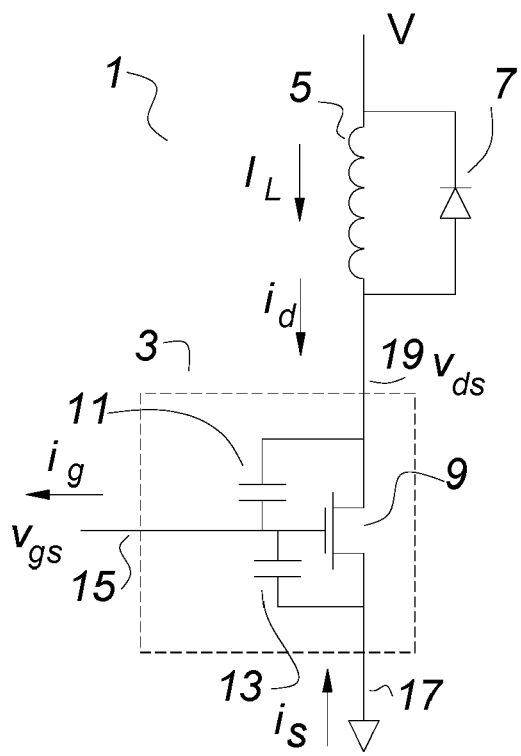
Fig. 1
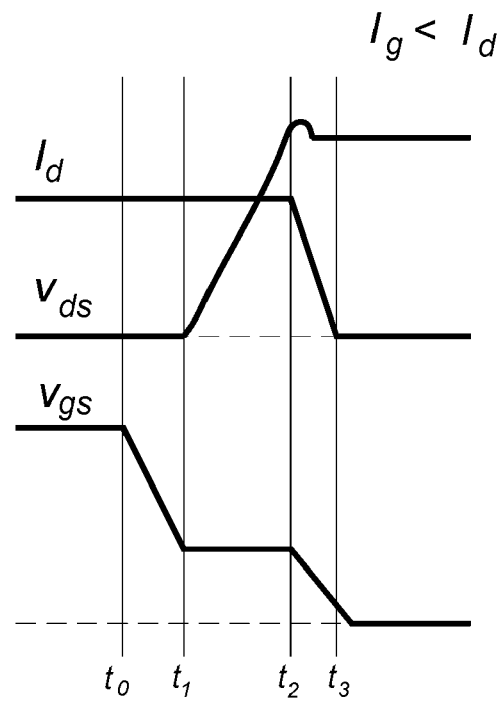
Fig. 2
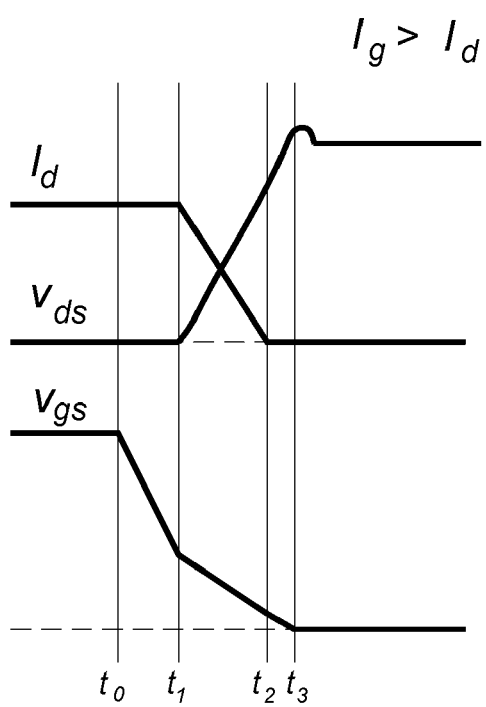
Fig. 3
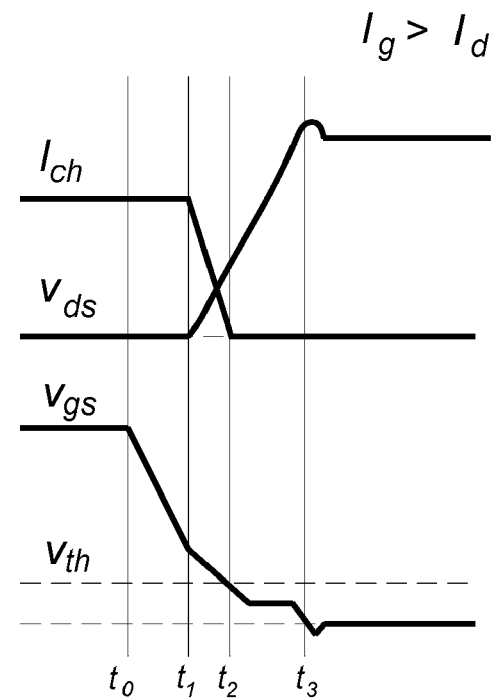
Fig. 3.1

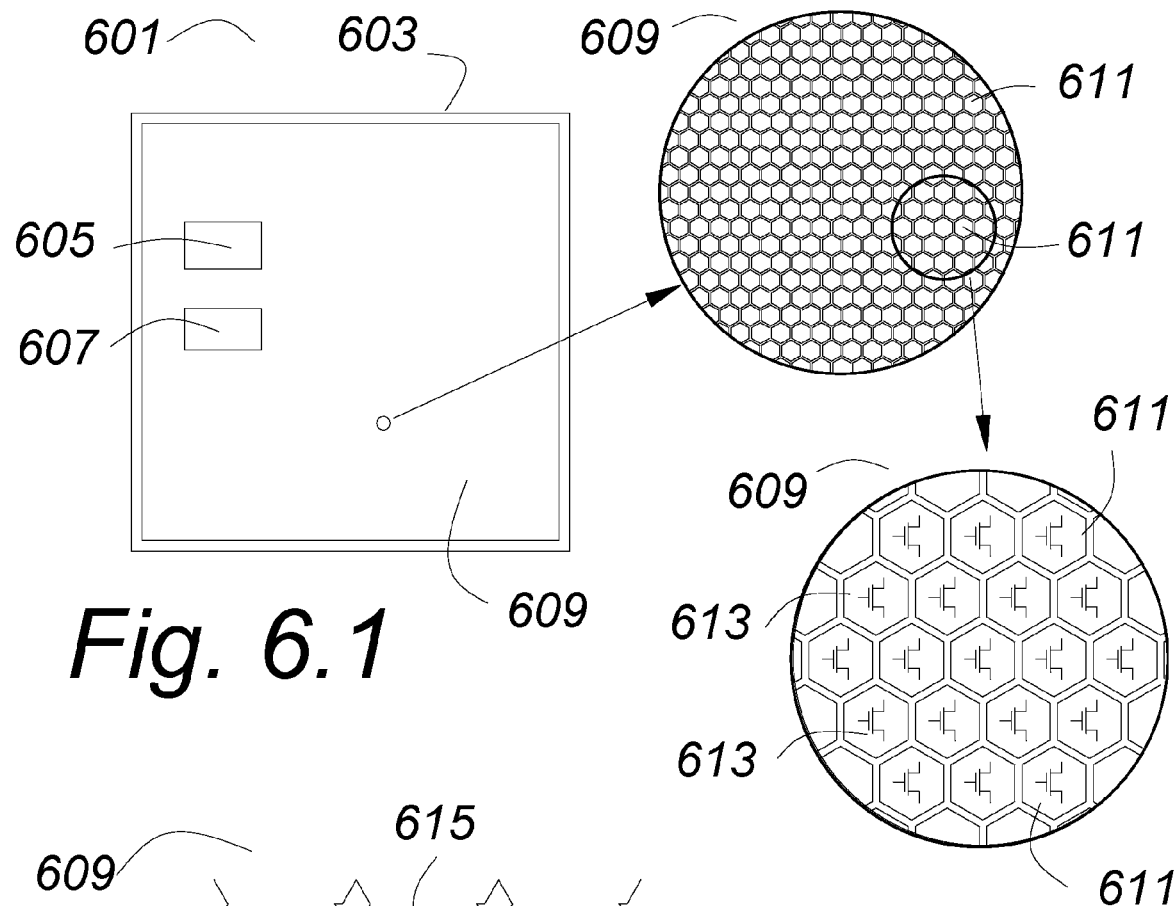
Fig. 6.1
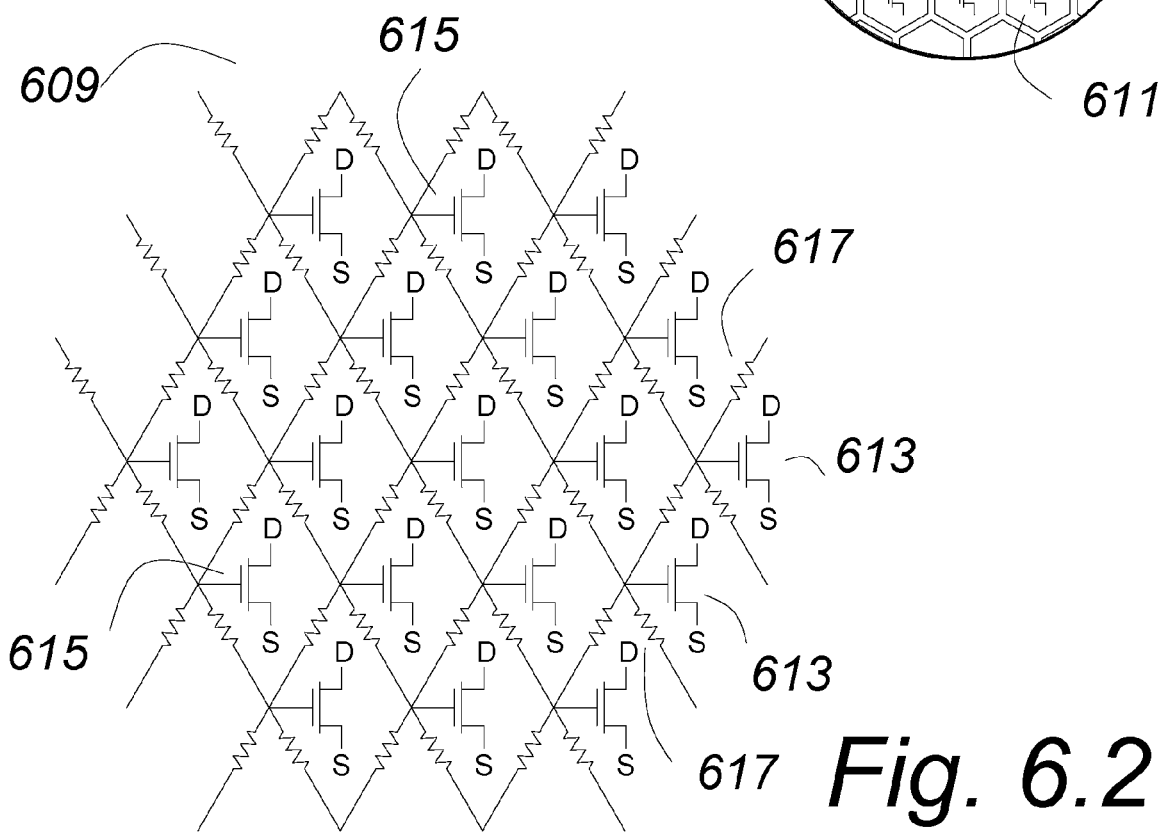
Fig. 6.2

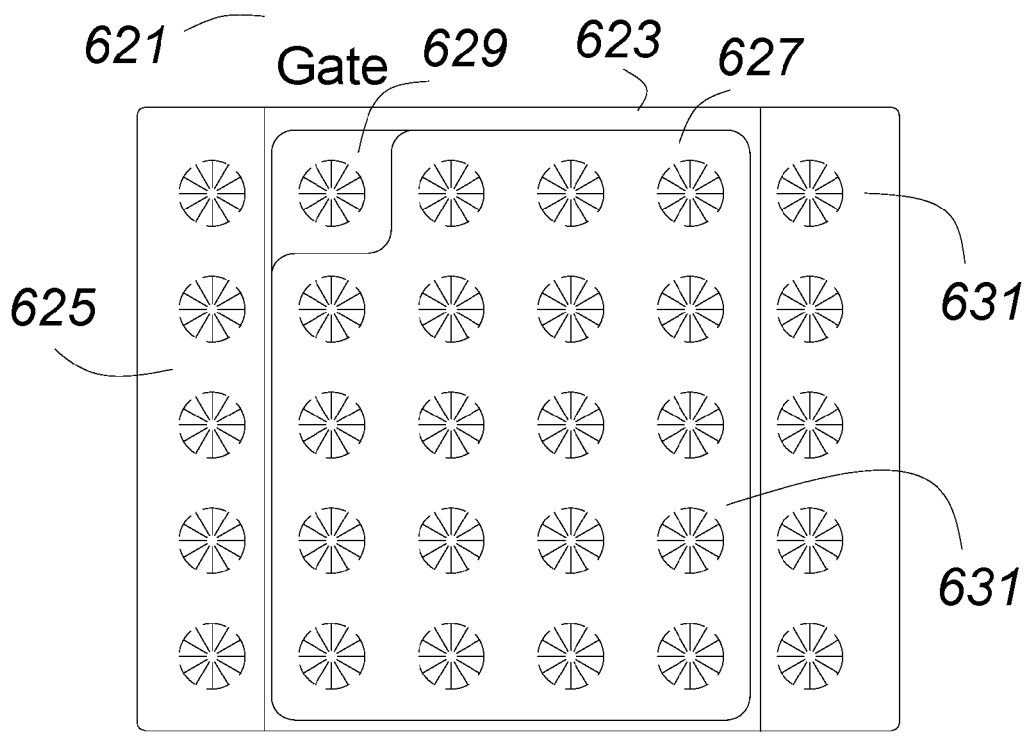
Fig. 6.3
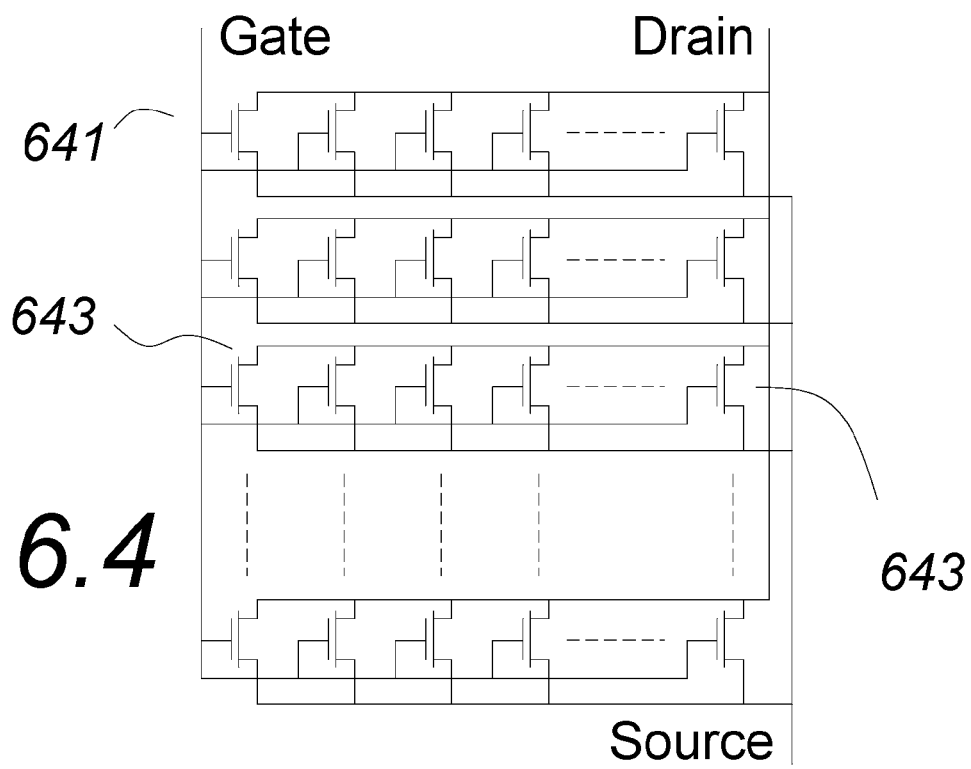
Fig. 6.4

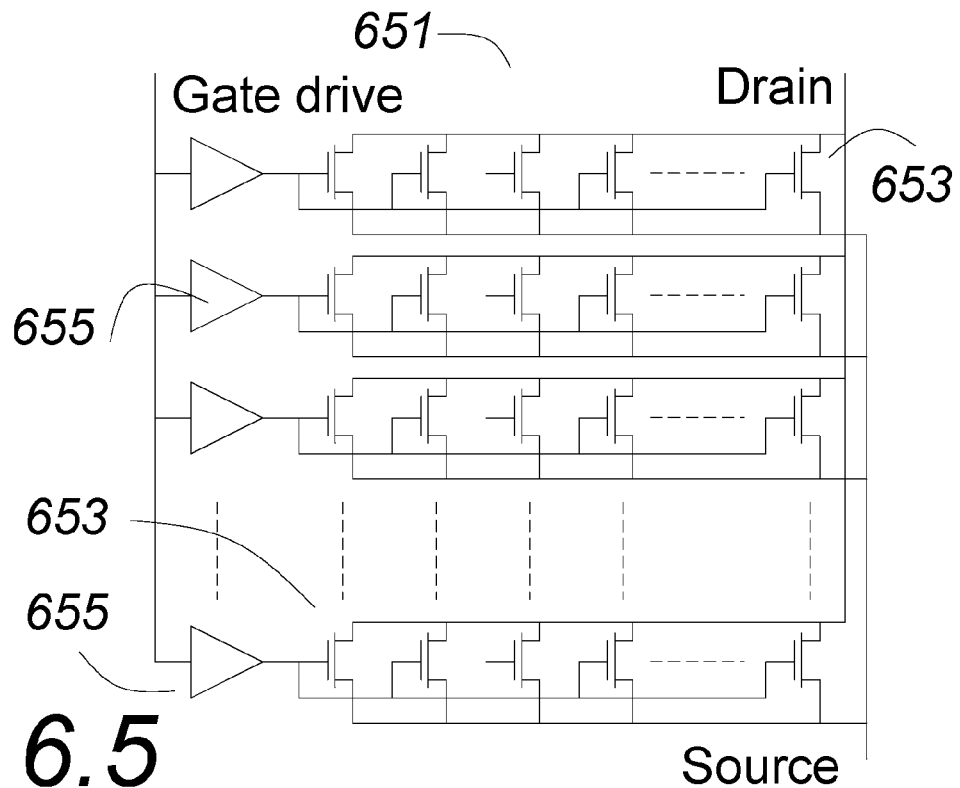
Fig. 6.5
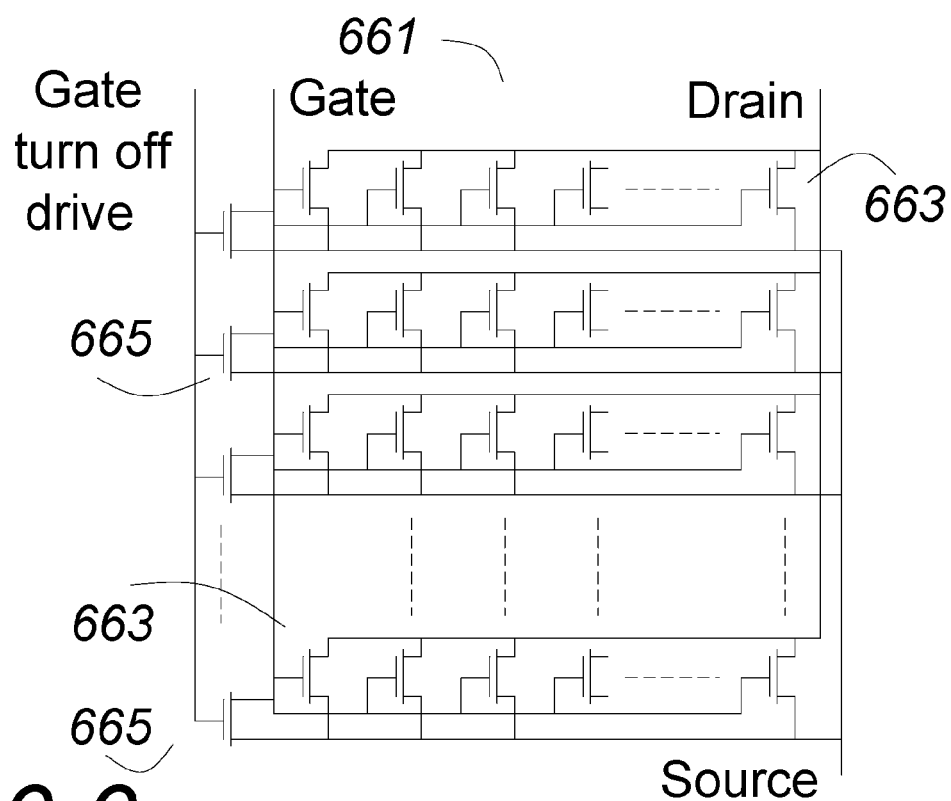
Fig. 6.6

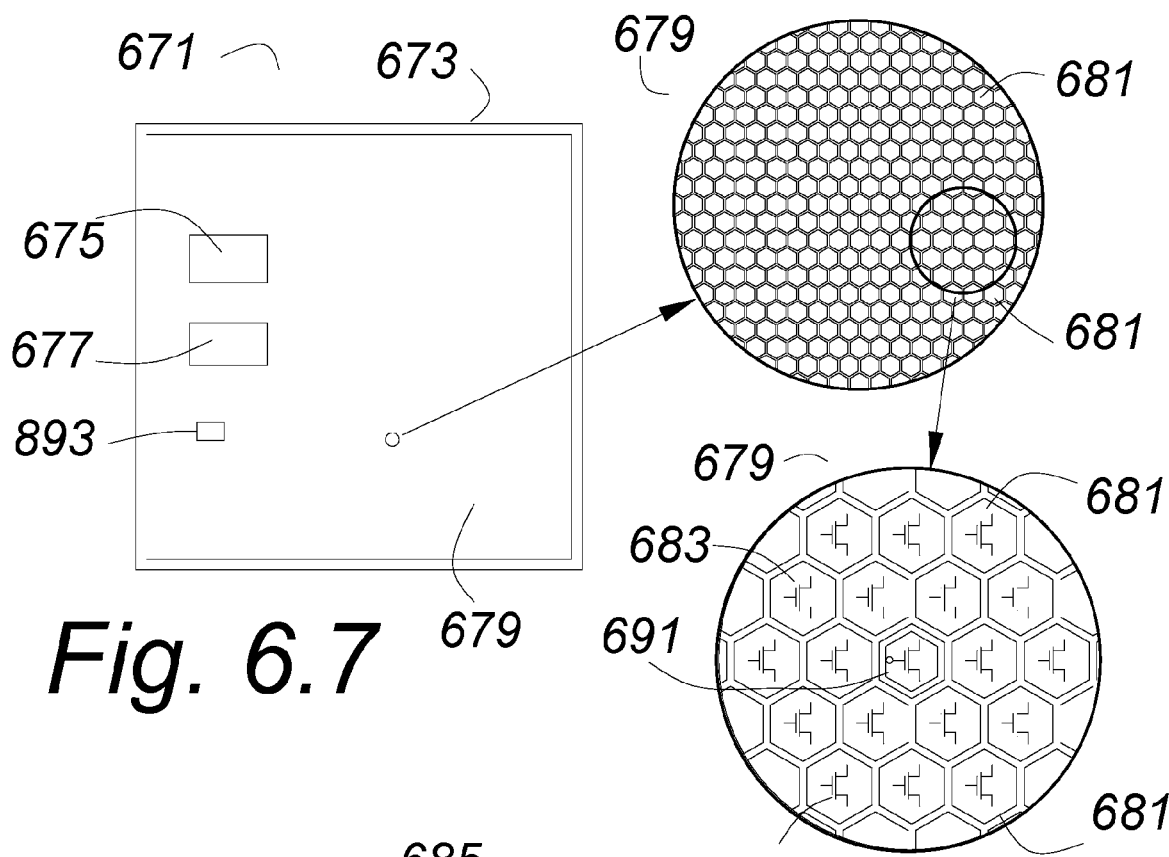
Fig. 6.7
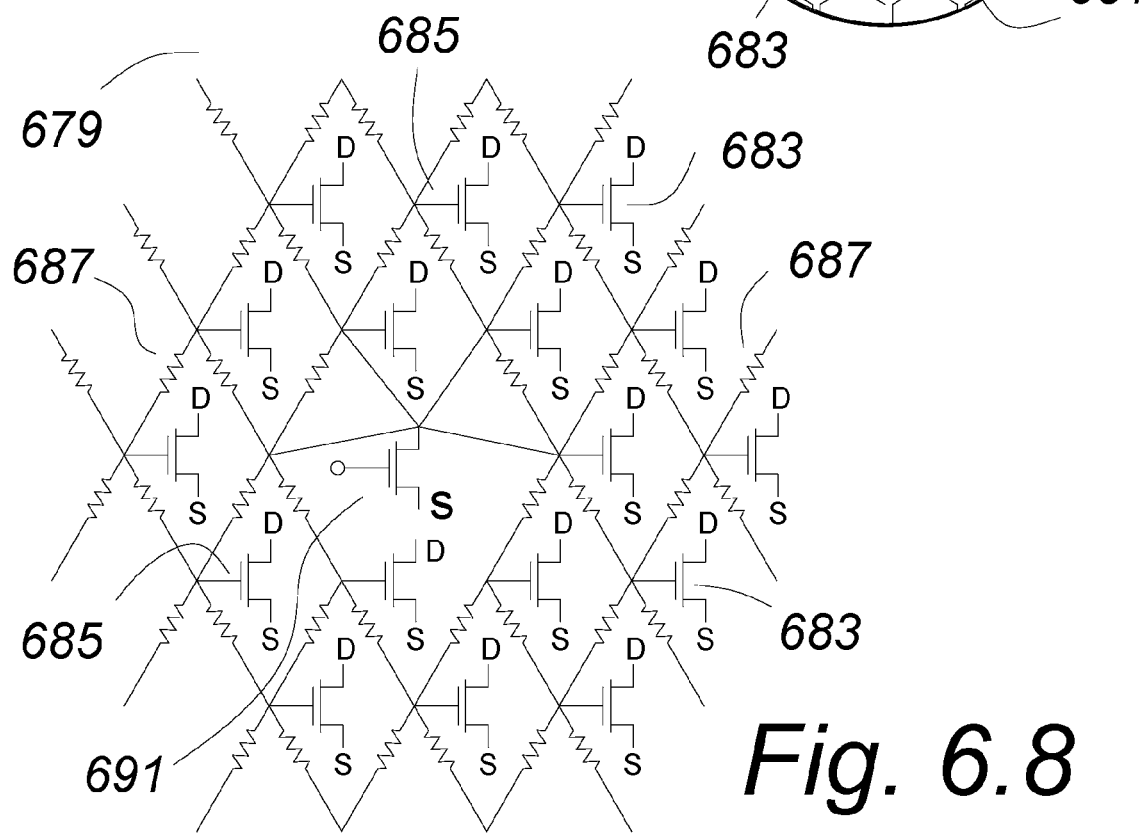
Fig. 6.8

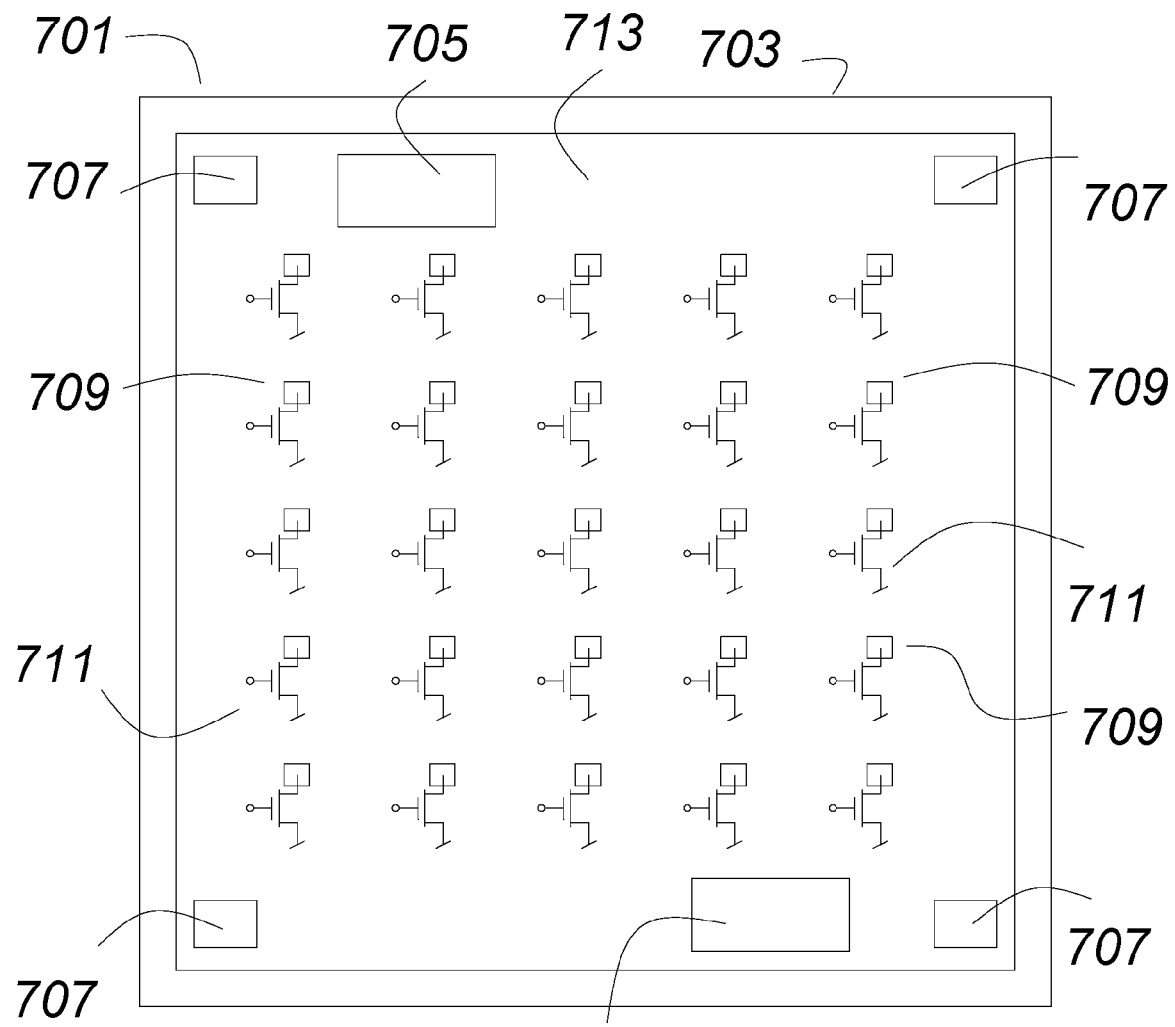
Fig. 6.9
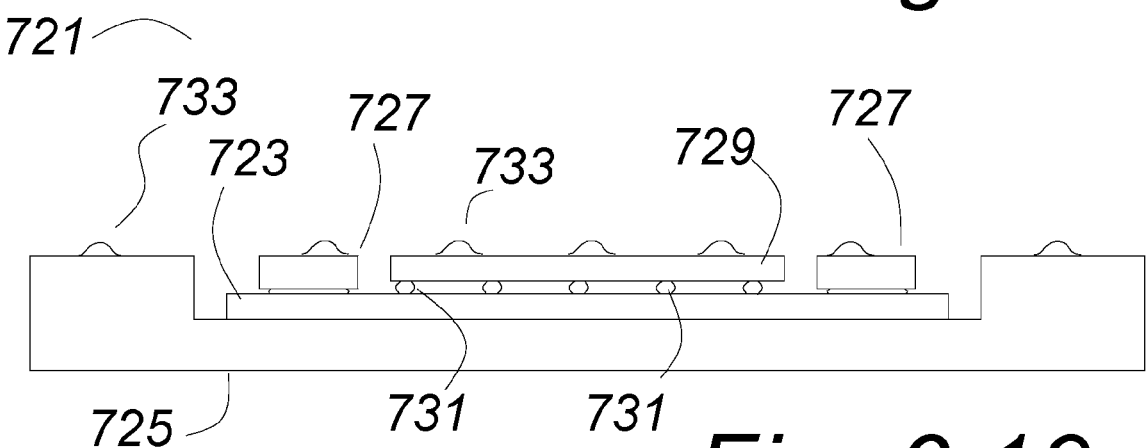
Fig. 6.10

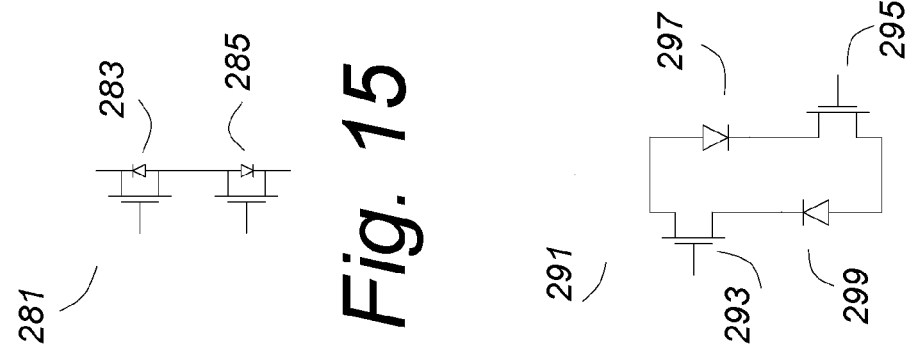
Fig. 15
Fig. 16
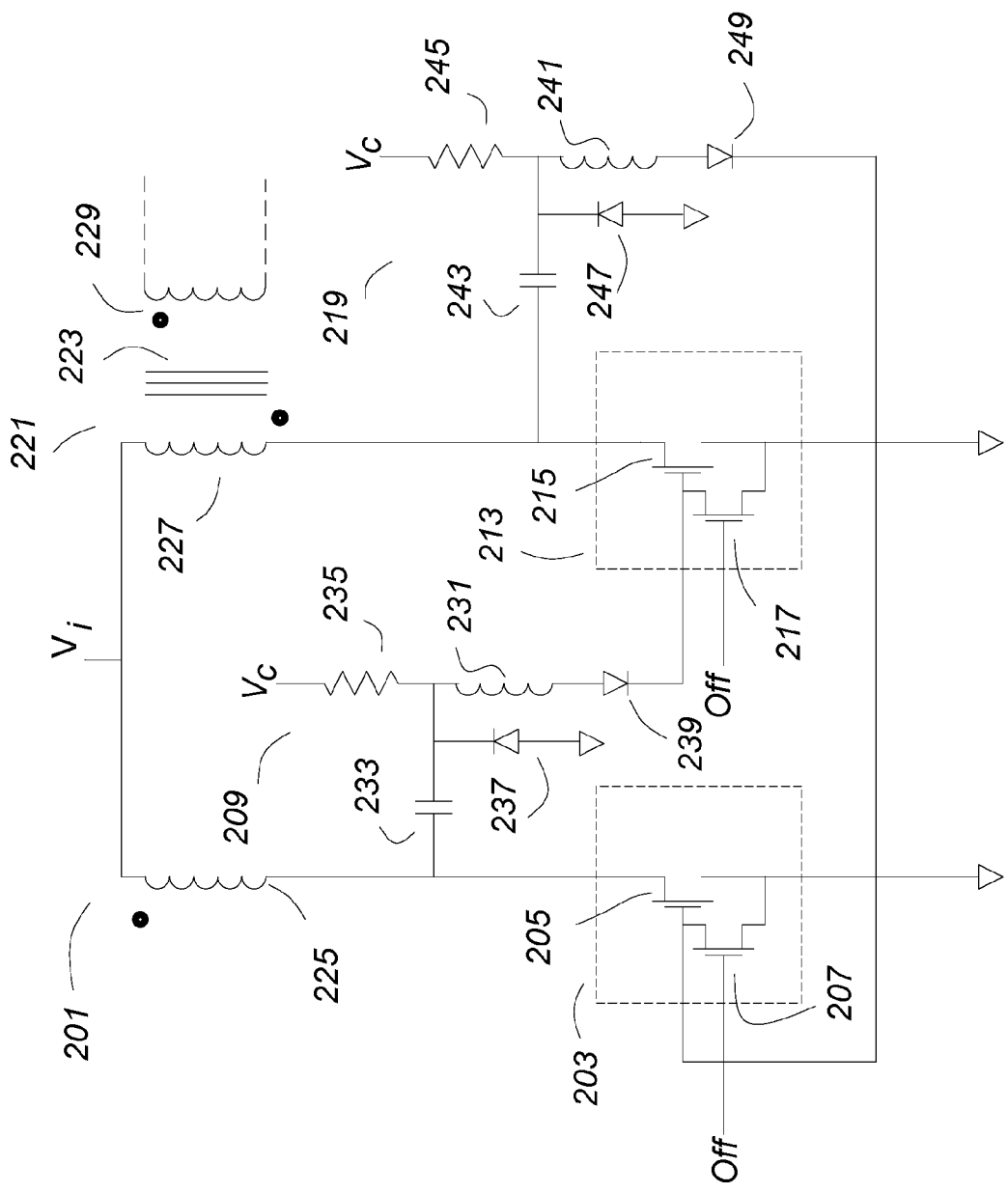
Fig. 13

GATE DRIVE METHOD AND APPARATUS FOR REDUCING LOSSES IN THE SWITCHING OF MOSFETS

CROSS REFERENCE TO RELATED APPLICATIONS

This patent application is a continuation in part application of a provisional patent application Ser. No. 60/319,085 filed Jan. 22, 2002 entitled "Gate Drive Method for Fast Turn-Off of MOSFETs", a provisional patent application Ser. No. 60/429,990 filed Nov. 27, 2002, entitled "Gate Drive Method and Apparatus for the Fast Switching of MOSFETs", and a patent application Ser. No. 10/248,438 filed Jan. 20, 2003, now abandoned, entitled "Gate Drive Method and Apparatus for Reducing Losses in the Switching of MOSFETs".

BACKGROUND OF INVENTION

This invention relates to gate drive circuits for MOSFETs (Metal Oxide Silicon Field Effect Transistors), and in particular, to methods of switching MOSFETs in power converters. This invention also relates to clamping circuits used to control the overshoot due to the current flowing in the circuit inductances at the turn off of the MOSFETs.

In power converters, it is important to minimize losses overall, and it is particularly important to minimize the losses in the MOSFETs. The gate characteristics have been studied extensively, and the "Miller effect" is well known to anyone who has worked with gate drive circuits. The Miller effect increases the apparent capacitance of the gate to source capacitance, thus require a robust gate drive. Further, during the time that the Miller effect is present, the crossover power dissipation in the MOSFET being switched is very high.

Determining the "Miller current" is fairly involved, but simplified, on turn off, the gate voltage will decrease as the gate capacitance is discharged until the gate voltage reaches the level that sustains the drain current. At this point, the "Miller shelf" becomes evident, that is, the gate voltage remains constant at the "Miller voltage", and the current out of the gate is determined by the impedance of the gate drive circuit and the Miller voltage.

There is an equal and opposite current into the gate, internal to the MOSFET, through the drain-gate capacitance, and the drain voltage rises at a rate such that the "Miller current" through the drain gate capacitance is in equilibrium with the current out of the gate. Once the drain voltage has reached its upper limit, the Miller current stops flowing through the drain gate capacitance to the gate. At this point, the gate voltage once again decreases, and the drain current decreases accordingly until the gate voltage reaches the cutoff threshold and the MOSFET is turned off.

During most of the turn off sequence, while the MOSFET is in its active region, there is both voltage across and current through the MOSFET drain to source, so there is power dissipated. This is the familiar "crossover power". It is well known to reduce the crossover power by using a lower impedance gate drive.

As is well known to one skilled in the art, a corresponding Miller effect may occur when the MOSFET is turned on. An exception is with "zero volt" switching.

SUMMARY OF INVENTION

This invention teaches that if the gate current exceeds the load current at turn off, there can be no Miller shelf.

It is an object of the invention to teach a method of turning off MOSFETs that reduces or eliminates the consequences of the Miller effect. It is a further object of the invention to teach a MOSFET having a gate that has sufficiently low impedance to implement the methods of the invention.

It is a further object of the invention to teach the use of a parallel capacitance to further reduce the Miller current. This is particularly applicable to circuits having a constant current.

It is a further object of the invention to teach a method of turning on a MOSFET that recovers energy for the gate drive.

It is a further object of the invention to teach methods of clamping converter circuits.

BRIEF DESCRIPTION OF DRAWINGS

FIG. 1 shows a MOSFET with a clamped inductor load.

FIG. 2 shows the Miller effects as usually presented in MOSFET application notes.

FIG. 3 shows that the Miller effect is greatly reduced if the gate current is greater than the drain current (switched constant current at the gate).

FIG. 3.1 shows that the Miller effect is greatly reduced if the gate current is greater than the drain current (low resistance from gate to source).

FIG. 6.1 shows that a MOSFET is comprised of a large number of cells.

FIG. 6.2 shows the resistive nature of the MOSFET gate mesh.

FIG. 6.3 shows a representative MOSFET package.

FIG. 6.4 shows a schematic diagram of the cells of a MOSFET and their interconnection.

FIG. 6.5 show that groups of cells could be controlled by drivers integrated into the MOSFET.

FIG. 6.6 shows a simplified driver scheme in which only gate turn off drivers are integrated into the MOSFET and turn on is through a usual gate terminal.

FIG. 6.7 shows a modification to the MOSFET of FIG. 6.1 to incorporate the gate turn off drivers of FIG. 6.6.

FIG. 6.8 shows how the gate turn off drivers of FIG. 6.6 connect to nodes of the gate mesh.

FIG. 6.9 shows a MOSFET die having a plurality of gate connections to points on the gate mesh.

FIG. 6.10 shows a possible MOSFET package.

FIG. 11 shows a MOSFET gate drive for turn on.

FIG. 12 shows another embodiment of a MOSFET gate drive for turn on.

FIG. 13 shows MOSFET gate drives for a push pull circuit.

FIG. 15 shows one embodiment of a bilateral controlled rectifier clamp.

FIG. 16 shows another embodiment of a bilateral controlled rectifier clamp.

DETAILED DESCRIPTION

Figure 4:
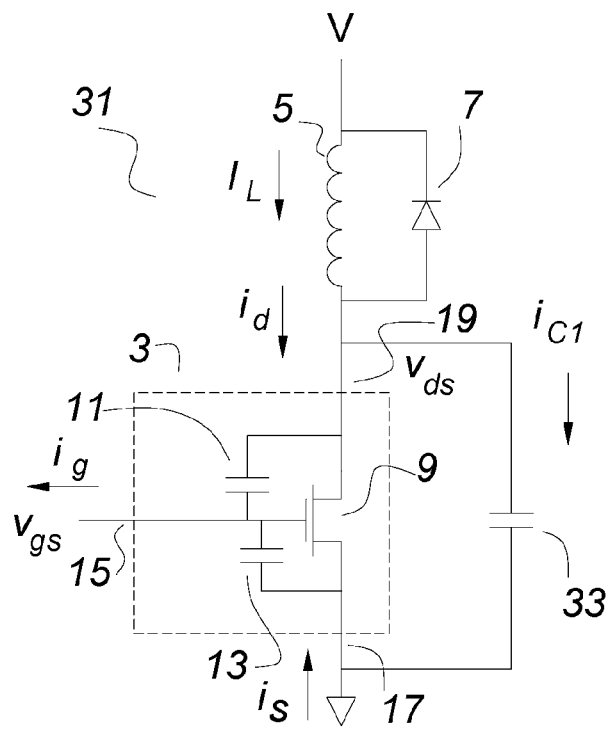
FIG. 4 shows the addition of a capacitor from the drain to the source.

FIG. 1 shows a MOSFET as it is often shown in MOSFET application notes. A MOSFET circuit 1 comprising a MOSFET 3 is driving an inductor 5. A clamp rectifier 7 prevents spiking when the MOSFET 3 is turned off by returning the excess energy to the voltage source V if the inductive kick at turn off exceeds the voltage source V. The MOSFET 3 has a gate 15, a source 17 and a drain 19. The drain-gate parasitic capacitor 11 and the parasitic gate-source capacitance 13 are shown with an ideal MOSFET 9 that together comprise the MOSFET 3.

Often in power converters and similar circuits, the load which the MOSFET 3 is switching is inductive, so the load current $I_L$ cannot change rapidly. It is an objective of this invention to switch the MOSFET very rapidly, in the order of nanoseconds or fractions of a nanosecond. During that time, being inductively fed, the load current $I_L$ will not change appreciably. For the purposes of this discussion, it is assumed to be constant over the switching time, for simplification.

The MOSFET usually is a three terminal device. The sum of the currents flowing into the MOSFET must equal zero. If a current $i_g$ flows from the gate 15 of the MOSFET 3, an equal and opposite current must flow into the other two terminals, the drain 19 and the source 17. That is, the gate current $i_g$ equals the sum of the drain current $i_d$ and source current $i_s$. The current flowing out of the gate 15 from the source 17 is the discharge current of the gate capacitance. (When the channel resistance is low, during the ON time, the source current $i_s$ may supply the discharge current for the drain-gate capacitance as well as the gate source capacitance. This is the condition when the gate voltage $V_{gs}$ is first dropping, before the MOSFET 3 begins turning off and the drain-source voltage $V_{ds}$ begins to rise. In this state, for this discussion, the gate to drain capacitance 11 and the gate to source capacitance 13 are lumped together as the "gate capacitance".) The load current $I_L$ flows into the drain 19, and at steady state conditions (MOSFET is ON and the gate voltage $V_{gs}$ is constant), the load current $I_L$ flows through the channel of the ideal MOSFET 9 and out of the source 17.

As is well known to power converter designers, the "Miller effect" is a significant problem in gate drive design. Switching losses are high because the crossover power is significant. The Miller effect is attributable to a current through the drain-gate capacitance as the drain voltage is rising, and it creates a feedback to the gate.

The current $i_g$ flowing out of the gate from the drain 19 through the drain-gate capacitance 11 (the Miller current) has as its upper limit the load current $I_L$. The implication of this is that if the gate current $i_g$ exceeds the load current $I_L$, the excess must come from the source current $i_s$, and must discharge the gate capacitance. The gate voltage $V_{gs}$ will continue to decrease, and there can be no "Miller shelf".

There is significant capacitance on the MOSFET drain 19, mainly the drain gate capacitance 11. Because the current $i_d$ into the drain is inductively fed, it will not change appreciably in the time of interest. Therefore, there is an upper limit to the rate at which the drain voltage $V_{ds}$ can rise, determined by the load current $I_L$ and the drain capacitance gate 11, given by $dV_{ds}/dt=I_L/C_{ds}$.

FIG. 2 shows the familiar gate characteristics during turn off, as described above and as often shown in MOSFET application notes. Turn off is initiated by reducing the gate voltage $V_{gs}$ as shown. At first, from $t_0$ to $t_1$, the gate voltage $V_{gs}$ decreases. This is the region where the gate voltage $V_{gs}$ is more than is needed to sustain the drain current $i_d$. When the gate voltage $V_{gs}$ drops sufficiently so that the MOSFET 3 begins to "pinch off", the channel resistance will begin to rise, and so will the drain voltage $V_{ds}$. Once the drain voltage $V_{ds}$ begins to rise, a current will flow through the drain gate capacitance 11. An equilibrium will be reached when the current through the drain-gate capacitance 11 equals the gate current $i_g$, and the gate voltage $V_{gs}$ will remain constant as the drain voltage $V_{ds}$ rises. During this time period, $t_1$ to $t_2$, the full load current $I_d$ continues to flow into the drain 19. When the drain voltage $V_{ds}$ reaches its final value, there will no longer be a Miller current through the gate-drain capacitance 11, and the gate voltage $V_{gs}$ will once again fall. As it does, so will the drain current $I_d$, from $t_2$ to $t_3$, governed by the transconductance characteristics of the MOSFET 3, as would be well known to one skilled in power converter design. At $t_3$, the threshold voltage is reached, and "pinch off" is complete. The gate voltage continues to discharge past $t_3$ to zero.

FIG. 3 shows that if the gate current $i_g$ exceeds the drain current $i_d$, then the gate capacitance will continue to discharge in the time period from $t_2$ to $t_3$, $V_{gs}$ will continue to fall, and the "Miller shelf" will be absent. This is because, as explained above, the drain current $i_d$ is the upper limit of the Miller current. If the gate current $i_g$ exceeds the Miller current, then the gate capacitance will discharge and the gate voltage $V_{gs}$ must fall. In FIG. 3, the gate current $i_g$ is shown as if it were from an ideal switched current source. The $I_d$ shown is the current through the channel.

As an aside, when trying to model the above behavior using available SPICE MOSFET models, even with a short circuited gate the crossover voltage and current characteristics were present. It seems that commercially available MOSFETs have too high a gate mesh resistance for the effect to be seen. Although it could not be seen at the gate terminal of the SPICE MOSFET models, the Miller shelf was present internally. The only way to show the teachings of this invention using available SPICE MOSFET models was to use a switched constant current source in the SPICE model on the gate, with the current source set to be larger than the drain current. Then the $I_d$ and $V_{ds}$ curves of FIG. 3 could be seen. A custom SPICE MOSFET model having a low gate mesh resistance had to be made and used to show the teachings of the invention. This showed convincingly that a new MOSFET design having a low gate mesh resistance would have to be made to use this invention.

In a gate drive of this invention, the gate drive for turn off will be a low resistance from the gate to the source, such as a turned on second MOSFET or plurality of MOSFETs. If the gate resistance is sufficiently low, Ig will be greater than $I_d$, and the graph will be as shown in FIG. 3.1. There will be a Miller shelf of sorts, not caused by an equilibrium as in the classical Miller effect, but rather after $t_2$, and it is the voltage drop across the gate drive resistance as the drain voltage is rising as the drain current charges the drain to gate capacitance 11. If designed in according with the teachings of this invention, this pseudo-Miller shelf will occur well below the cut-off gate voltage Vth so that there will be no lossy conduction through the channel during this time, $t_2$ to $t_3$. The $I_d$ shown is the current through the channel. The voltage of the pseudo-Miller shelf will be $I_g$ times the resistance of the gate drive circuit (the driver resistance plus the gate mesh resistance of the MOSFET being switched and any other circuit loop resistances).

As shown in the circuit 31 of FIG. 4, this invention also teaches that a parallel capacitor 33 can be connected from the drain to the source of the MOSFET 3. This now makes parallel curent paths through the drain gate capacitance 11 and the parallel capacitor 33. From the above discussion, the load current $I_L$ is the upper limit of the Miller current, but with an additional parallel capacitor, the load current is now the upper limit of the charging current for both capacitors. As would be well understood by one skilled in the art of circuit analysis, the load current would divide, part flowing into the drain gate capacitance 11 and the rest flowing into the parallel capacitor 33. The current divides as the value of the respective capacitors, so the Miller current now has a new, smaller upper limit. As an example, not a limitation, if the parallel capacitor 33 equals the drain source capacitor 11 (ignoring the nonlinear nature of the drain gate capacitor for simplification), then the upper limit of the Miller current is now half what it would have been without the parallel capacitor 33. Also, the capacitance being double, the rate of rise of the drain voltage is now one half. With larger parallel capacitors, the rate of rise can be made slower yet, and upper limit of the current into the drain-gate capacitance can be reduced further.

While the current through the drain gate capacitance is reduced, the time that it flows is increased proportionately. Thus the total charge passing through the drain gate capacitance is the same for otherwise similar conditions. The power dissipated in the gate sink is reduced significantly, though. The power is proportional to the resistance times the square of the current times the time. If the current is halved, and the time is doubled, the power is half. Or, the resistance can be twice as much for a comparable voltage drop and power. This is a design trade off that would be understood by one skilled in the art of power converters.

It is a goal that the gate voltage $V_{gs}$ be brought below cutoff before the drain voltage $V_{ds}$ rises appreciably. If that can be accomplished, there will be no conduction through the channel as the drain voltage $V_{ds}$ rises, so the crossover power is substantially reduced.

The actual transition is complicated, and three currents can be defined, the current through the MOSFET channel, the current through the drain gate capacitor and the current through the capacitor C1. The MOSFET channel has significant resistance once turn off is underway and the drain voltage is beginning to rise, and it will pinch off rapidly as the gate voltage drops. Once the cut-off threshold is reached, the current divides between the capacitors. However, the simplified analysis and drawing shows the concept of the invention.

It is know to use a capacitor to reduce the gate current, but for most circuits there is a heavy penalty. If the circuit is other than a zero voltage switching circuit, the extra capacitance increases the turn on losses as the capacitor is discharged into the MOSFET as it turns on. Also, the charge time of the capacitor depends upon the load current. If the power converter must operate to a low (or zero) output current, the charging current may be little more than the magnetization current of a transformer, and the switching time may be excessive, limiting the duty cycle.

U.S. Pat. No. 6,388,287 (Deboy et al) shows the use of a voltage controlled capacitor to reduce the energy loss at turn on and to reduce the switching time over that of a fixed capacitor.

One application for which the circuit of FIG. 4 is well adapted is a power converter operating at a constant current, such as a fast transition power converter. With a constant current, this invention teaches that the capacitor charging current is fixed and the circuit can be optimized for that current. One such application is the constant current generator for a fast transition power converter.

Figure 5:
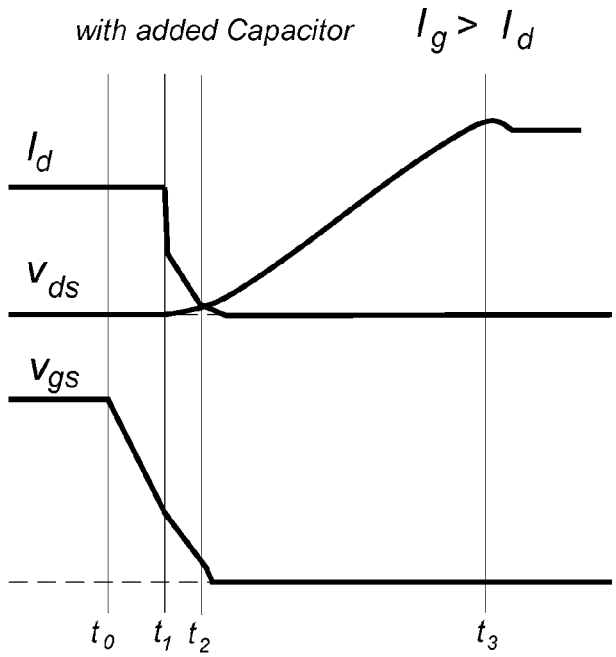
FIG. 5 shows the effects of the added capacitance on the gate characteristics, again with the drain current larger than the drain current.

FIG. 5 shows the modified turn off characteristics of the MOSFET 3 with the gate current $i_g$ larger than the load current $I_L$ and with a parallel capacitor 33. As before, from $t_1$ to $t_2$, the gate voltage $V_{gs}$ falls. At $t_1$, the drain voltage $V_{ds}$ begins to rise, and the load current $I_L$ (essentially a constant) now divides, part flowing through the channel of the MOSFET 3 as $I_d$, part flowing through the drain-gate capacitance 11 and part flowing through the parallel capacitor 33 as $i_{C1}$. The gate voltage $V_{gs}$ continues to fall rapidly, so the current through the channel of the ideal MOSFET 9 must as well. If this is sufficiently fast, pinch off will occur before the drain voltage $V_{ds}$ has risen appreciably, and the cross over power is very substantially reduced. The $I_d$ shown is the current through the channel.

Figure 6:
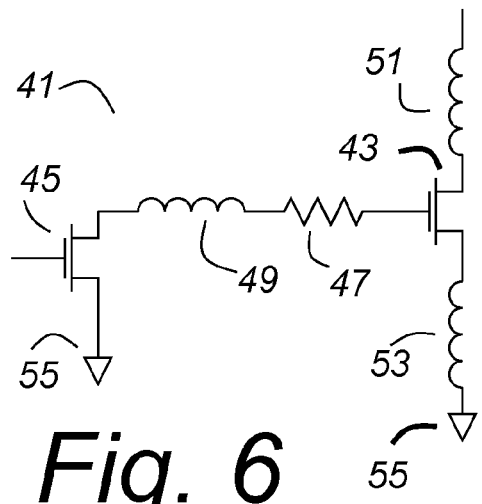
FIG. 6 shows a MOSFET with some of its parasitic components and a second MOSFET for turn-off.

FIG. 6 shows a circuit 41 which illustrates some of the parasitic impedances surrounding a first MOSFET 43. A second MOSFET 45 is intended to pull the gate of the first MOSFET low very quickly. However, the driving MOSFET 45 has a drain source resistance and the gate has a significant mesh resistance, collectively the resistor 47. A MOSFET package has significant inductances, the gate inductance 49, the drain inductance 51 and the source inductance 53. The second MOSFET 45 and the first MOSFET 43 have a common ground return 55, so the gate inductance 49 and the source inductance 53 are in series with respect to the second MOSFET 45 as a gate sink. Further, the source inductance 53 is a common impedance with the load current, and significant voltage can be induced therein as the source current changes. It is important to reduce these impedances as much as possible.

In order to achieve a very fast turnoff of the MOSFET, the gate circuit must have a very low impedance, including both the resistive and inductive components. Several obstacles must be overcome to achieve this. The first is that the lead inductance of a usual MOSFET package is significant, too high to allow the very fast rise in gate current required. Thus it is preferred that the gate drive switch be on or very closely proximate to the MOSFET die.

Commercially available MOSFETs for power converter applications are not well suited for very fast, high current gate drive. The lead and package inductances are much too high, as is the gate mesh resistance. Of particular concern is the gate mesh resistance, shown lumped into the resistance 47 in FIG. 6. Not only does the gate mesh resistance limit the gate current, it also forms a distributed RC—RC—RC circuit to the various cells of the MOSFET, and there can be significant delay to the cells that are most remote from the gate metalization.

FIG. 6.1 shows a representative construction of a MOSFET die 601. MOSFETs are made with a variety of geometries, both lateral and vertical. As an illustration, not a limitation, the MOSFET die 601 may have a drain connection 603 that is the bottom surface of the MOSFET die 601. It may further have one or more source pads 605 or gate pads 607. The active region 609 of the MOSFET die 601 comprises a very large number of cells 611—611, often several millions. Each of the cells 611—611 may comprise a MOSFET switch 613—613. In some die geometries, the cells may indeed be a large number of isolated cells, but in other geometries, the trench MOSFET as an example, not a limitation, the separation between MOSFET cells is not as definite. Regardless, for this invention it suffices to say that the die is, or could be by the design of the diffusion masks and conductor layout, a very large number of smaller MOSFET switches 613—613.

FIG. 6.2 shows the MOSFET cells 613—613 comprising common drain connections D—D and source connections S—S. As an illustration, not a limitation, the drain connections D—D may be the common bottom surface of the MOSFET die 601 and the source connections S—S may be a common source metalization. The gate connections 615—615 of the MOSFET cells 613—613 is a gate mesh having a fairly high resistivity, shown diagrammatically as a mesh of resistors 617—617, often polysilicon.

FIG. 6.3 shows an example of a packaged MOSFET 621 comprising a MOSFET die 623 mounted on a carrier 625 to which the MOSFET die 621 is bonded. The drain connection of the MOSFET die 623 is its bottom surface, and the carrier 625 conducts current to the sides. The source connection 627 of the MOSFET die 623 is a top metalization, and the gate connection 229 is a pad in the corner of the MOSFET die. A plurality of solder bumps 631—631 allow connection to an external circuit, not shown. This structure is shown as an example, not a limitation. Note that there are a large number of solder bumps 631—631 for the source connection 627, but only one for the gate connection 629. Note further that the gate connection 629 is located in a corner of the MOSFET die 623. The gate current has to spread through the gate metalization and the gate mesh resistance from the corner to the far edges of the MOSFET die 632.

Many MOSFET dice have gate metalization and gate connections that are more centrally located, and some even have more than one gate connection. It is still the usual practice to design the gate connection and its mesh for relatively low current as compared to the current flowing from the drain to the source of a MOSFET. MOSFET gate drivers are usually lower power driver circuits, often integrated circuits, and the limitations of these circuits are reflected in the design of the gate connections and gate mesh. Given the driving power of the drivers, there was little recognized need to design a lower impedance connection and gate mesh.

It is also usual to teach that the gate drive should be slowed down by incorporating series resistance as a technique for slowing the switching speed and reducing noise. A consequence of this is higher crossover power, and many designers do use lower impedance gate drives to reduce crossover power, with noise versus crossover power being an accepted design trade off.

FIG. 6.4 shows schematically a MOSFET die 641 comprising a plurality of MOSFET cells 643—643 with common drain, source and gate connections.

A MOSFET die comprises a large number of MOSFET cells, perhaps as many as several million. In theory, each cell could be individually driven by an equal number of drivers. It would not be possible to connect so many external drivers, but, in theory, the same number of individual drivers could be integrated into the die as an integrated circuit. A more practical approach is to group a number of cells together, and provide a driver for each group of cells, as shown schematically in FIG. 6.5. A MOSFET die 651 comprises a large number of MOSFET cells 653—653 all having a common drain connection and a common source connection. The MOSFET cells 653—653 are in groups, and a plurality of drivers 655—655 having a common gate drive input are integrated into the MOSFET die 651. For vertical MOSFETs, the drain connections are necessarily common, but it would be possible to isolate the drains of groups of cells in other integrated circuit arrangements. It would also be possible to isolate the source connections of the groups of cells with a specialized source metalization. But, for an improved general purpose MOSFET, the usually common drain and common source connections are used with a single gate drive to the gate drivers 655—655.

The circuit of FIG. 6.5 has a number of practical limitations. For one, the large number of drivers that can both source and sink gate current represent quite a complex circuit with a correspondingly complex manufacturing process. Further, to source gate current, there must be a distributed current supply mesh to the gate drivers.

FIG. 6.6 shows a much simpler alternative. A MOSFET die 61 comprises a large number of MOSFET cells 663—663 arranged in groups. For each group, there is another MOSFET gate turn off driver 665 connected from the gate mesh to the source metalization. The distributed gate mesh is still connected to a gate termination. It is contemplated that the gate turn off drivers 665—665 would be integrated into the MOSFET die 661, however they could be external to the MOSFET die 661 if connected through very low impedance interconnections.

In many circuits, it is important to turn off a MOSFET very quickly with a very low resistance driver. An example is the teachings of this invention wherein the Miller effect can be reduced or eliminated by having a gate current that exceeds the drain current and by having the gate discharge time be fast compared to the drain-gate capacitance charge time. Another example is in the fast transition power converter. In these same circuits, it may be acceptable to turn on the MOSFET more slowly, and a conventional gate mesh resistance is not a problem. By using the conventional gate mesh for turn on, the problem of providing drivers which can source current and a power distribution to them is avoided.

FIG. 6.7 shows how a MOSFET die of this invention might be constructed, as an illustration, not a limitation. A MOSFET die 671 has a drain connection 673 that is the bottom surface of the MOSFET die 671. The top surface 679 of the MOSFET die 671 may have a source connection 675 and a gate connection 677, and the active region 679 of the MOSFET comprises a large number of MOSFET cells 681—681. Each of the MOSFET cells 681—681 can be represented as a MOSFET 683—683. Distributed among the MOSFET cells 681—681 are specialized gate turn off driver cells 691 for turning off the MOSFETs 683—683. As shown in FIG. 6.8, with reference to FIGS. 6.6 and 6.7, the gate mesh for the MOSFETs 683—683 is represented by a plurality of resistors 687—687 connecting the gates 685—685 of the MOSFETs 683—683 to the gate connection 675. At numerous nodes throughout the MOSFET die 671, the specialized gate turn off drivers 691 connect the gate mesh to the source metalization S. The driver cells 691 are turned on by a common gate turn off drive connection 893.

While the specialized gate driver cells must be in isolated regions requiring extra masking and diffusion steps and must be connected by a special metalization or other conducting layer, the complexity is very much less than it would be using full drivers as in FIG. 6.5.

FIG. 6.9 shows an alternative to using integrated gate turn off driver cells. A MOSFET die 701 has a drain termination 703 that is the bottom surface of the MOSFET die 701.

Source terminations 705, 705 provide a connection to the source metalization 713 and gate terminations 707—707 connect to the gate mesh as in a prior art MOSFET. Distributed over the surface of the MOSFET die 701 are a large number of additional gate connections 709—709 to the gate mesh such that no cell within the MOSFET die is very far from one of the gate connection 709—709. On the die, a large number of MOSFETs 711—711 are shown connecting the gate drive connections 709—709 to the source metalization. These MOSFETs 711—711 are for illustration only, and may not represent physical MOSFETs but rather show schematically that the MOSFET die 701 can be turned off very rapidly and with a very low resistance by connecting the gate drive connections 709—709 to the source metalization 713 through switching means. Turn on can be through the gate terminations 707—707.

FIG. 6.10 shows how a MOSFET die (such as the MOSFET die 701 of FIG. 6.9 as an illustration, not a limitation) might be packaged. A MOSFET assembly 721 comprises a MOSFET die 723 mounted in a carrier 725 that is the drain connection and that connects to the bottom surface of the MOSFET die 723. To provide a distributed gate turn off drive, a gate turn off driver die 729 die is mounted on the MOSFET die 723 as by a plurality of ball bonds 731—731, as an illustration, not a limitation. A source connection 727—727 may comprise a metal frame. Its purpose, and the purpose of the upward side extensions on the carrier 725 are to extend the source and drain connections to a common plane surface for mounting on a circuit board or similar mounting surface through a plurality of solder bumps 733—733, as an illustration, not a limitation. Similarly, solder bumps 733—733 may terminate the gate turn off driver die 729 to the circuit board. It is contemplated that a large number of distributed connections would be made to the MOSFET die 723 to connect through switching means on the gate turn off driver die 729 a large number of connections between the gate mesh of the MOSFET die 723 and the source metalization of the MOSFET die 723, and as further illustrated in FIG. 6.9.

There are other techniques to reduce the resistivity of the gate net, and one can find references in the literature to metal gates (amorphous ternary metals, damascene, or metal "T" gates, as examples), silicided polysilicon gates, or nickel silicided, gates. (Some RF MOSFETs use exotic gates, but these specialized MOSFETs may not be suitable for general purpose power converter designs). The teachings of this invention may make such techniques unnecessary, or they could be used in combination for an enhanced combined effect.

The gate drive used to turn off a MOSFET (for instance, the second MOSFET 45 of FIG. 6), must also have very low impedance, both a low resistance and a low inductance. A MOSFET comprises a very large number of cells. In theory, each cell could be controlled independently with separate drivers. In practice, there may be too many of them, but the cells can be divided into groups of cells occupying a fairly small area on the MOSFET die. Each of the groups of cells can be driven by a driver having very low impedance connections to the source and gate connections of the several groups of cells. By having a large number of drivers each driving a small group of cells, the whole is massively paralleled. The many small drivers can be very fast, and the resistance and inductance of the interconnections are effectively paralleled, each one conducting a small current.

To implement a very fast gate drive with gate current that is large compared to the drain current, a new MOSFET packaging arrangement is necessary. The gate mesh resistance can be managed by making a large number of gate connection points widely distributed over the MOSFET die so that the distance through any part of the gate mesh is short, and the resistance is massively paralleled. A good arrangement would be to have a large number of gate driver cells integrated into the MOSFET, with very short local connections to the gate connection points and to the source metalization.

Figure 7:
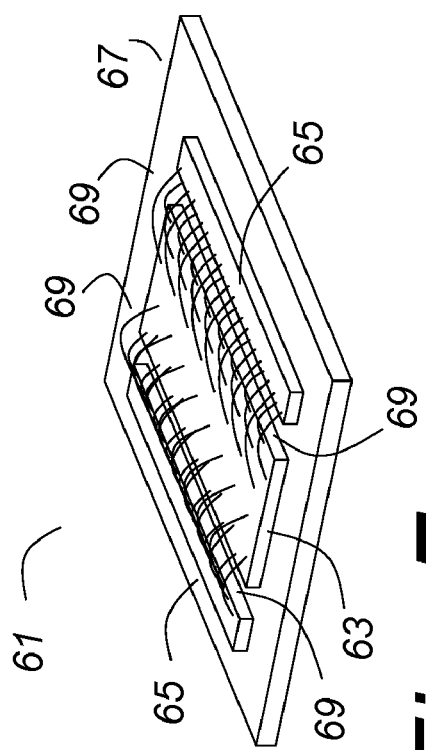
FIG. 7 shows a MOSFET die with immediately adjacent gate drive chips and a plurality of parallel interconnections.

FIG. 7 shows a MOSFET package diagram 61 comprising a substrate 67 upon which there are gate drive driver chips 65—65 immediately proximate to a MOSFET die 63 with a large number of interconnections 69—69 to groups of cells and the source metalization of the MOSFET die 63.

U.S. Pat. No. 4,492,883 shows a MOSFET with a plurality of junction FETs providing a sink to turn off the MOSFET but it does not show a large number of parallel connections for low impedance, nor does it teach any other aspects of this invention, and in particular it does not teach a gate current larger than the drain current for reduced crossover power.

Figure 8:
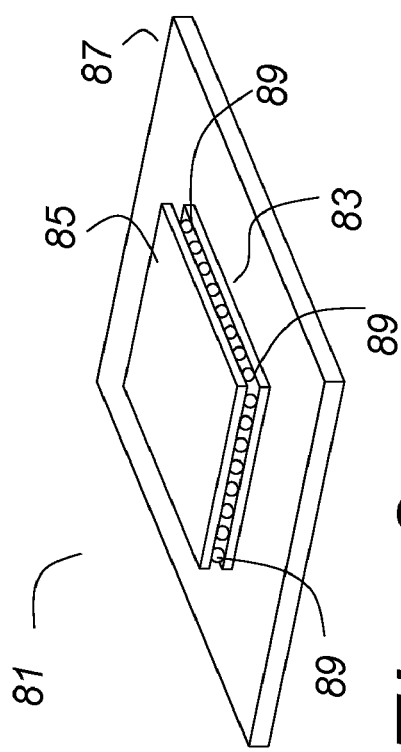
FIG. 8 shows a MOSFET die with a gate drive die mounted on it, as by solder bumps or ball grid connections.

FIG. 8 shows a MOSFET package diagram 81 comprising a substrate 87 with a MOSFET die 83 mounted thereon. A gate driver chip 85 is mounted on the MOSFET die 83, and it is connected to a large number of gate connection points through solder bumps, ball grid or the like 89—89.

Figure 9:
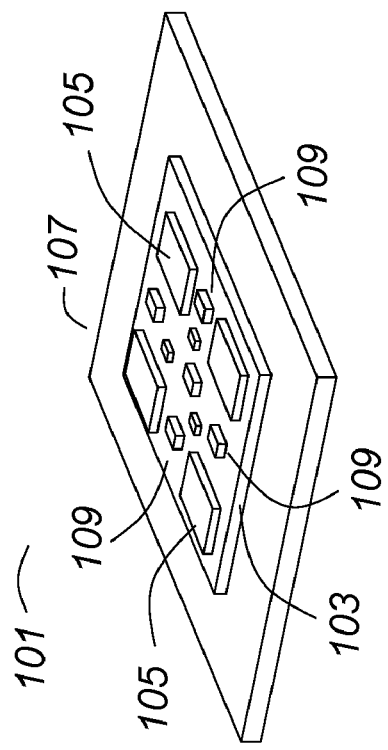
FIG. 9 shows a MOSFET die with a driver circuit mounted on it in the manner of a hybrid circuit.

FIG. 9 shows a MOSFET package diagram 101 comprising a substrate 107 with a MOSFET die 103 mounted thereon. Various components 105—105 and 109—109 of a gate drive circuit are mounted on the MOSFET die 103, in the manner of a hybrid circuit, with a large number of gate and source connections to the MOSFET die 103.

U.S. Pat. No. 6,593,622 (Kinzer et al) shows a MOSFET die with gate drive circuits mounted thereon, but it does not show a large number of parallel connections for low impedance, nor does it teach any other aspects of this invention, and in particular it does not teach a gate current larger than the drain current for reduced crossover power.

Propagation delay is important, and it should be minimized, but the more critical consideration is the rapid discharge of the gate capacitance once the propagation delay through the control logic has played out and the actual switching is happening.

Typically, in a MOSFET, the Rds is very low in the ON state, and will have millivolts of forward drop at the rated current. In this invention, the gate drive must carry an even larger current, and the question arises about just how low its impedance must be. It must be low, but it can be significantly higher than the Rds of the MOSFET. Whereas the MOSFET will have a voltage drop in millivolts, the gate drive can have higher voltage drop. So, even if it is carrying a current that is larger than the drain current, it may still have a larger resistance. For one, the current is pulsed and has a very short duration. For another, it can have a drop of several tenths of a volt, (or even a volt or more for a MOSFET with a high cutoff threshold) and still pull the gate down with sufficient current. Further, the MOSFET being switched may be a higher voltage device and may have to withhold a high voltage, but the gate drive will have a voltage that is comparatively very low. Thus the silicon area needed for the gate drive pull-down MOSFET can be small compared to silicon area of the MOSFET being switched.

More specifically, with a MOSFET being switched that is designed for a maximum drain current $I_d$, and a gate pinch off threshold voltage of $V_{th}$, the resistance of the turn off driver circuit must be less than a resistance equal to $V_{th}/I_d$. This is the marginal case, and preferably the resistance is much less than $V_{th}/I_d$. For the case with a parallel capacitor $C_p$, this resistance can be larger, by a factor of $(C_p+C_{dg})/C_{dg}$. In this specification and the claims, a recitation that the gate of a first MOSFET is characterized by having a very low gate resistance; the on resistance of the a second MOSFET is characterized by having a very low channel resistances the source connection has a very low impedance; and the drain-gate connection has a very low impedance so that when the MOSFET is turned on, a gate current is will flow from the gate of the first MOSFET to the source of the first MOSFET through the at least a second MOSFET so that the gate current $i_g$ is larger than the load current $i_d$ means that sum of the respective resistances and impedances is sufficiently low so that the sum of the respective resistances and impedances is less than the ratio $V_{th}/I_d$.

When turning off the MOSFET very rapidly, the load current, being inductive, will continue to flow, charging the drain capacitance (and any parallel capacitors), and it will rapidly charge the drain capacitance to a high level, resulting in an "inductive kick". This can result in very high transient voltages and ringing. Thus, if very fast turn off is used, it is important to have an effective clamp to limit the voltages in the circuit to a safe level.

It is well know to clamp the inductive kick to limit the voltage transient. Often the clamp is a diode to the supply voltage, and, with ideal components, as soon as the drain voltage exceeded the supply voltage, the clamping diode would conduct, drawing off the excess energy and limiting the voltage spike. Unfortunately, with practical circuits, the parasitic inductances of the circuit are significant, and damaging voltage spikes can be present even with a clamp on the inductive load.

Figure 10:
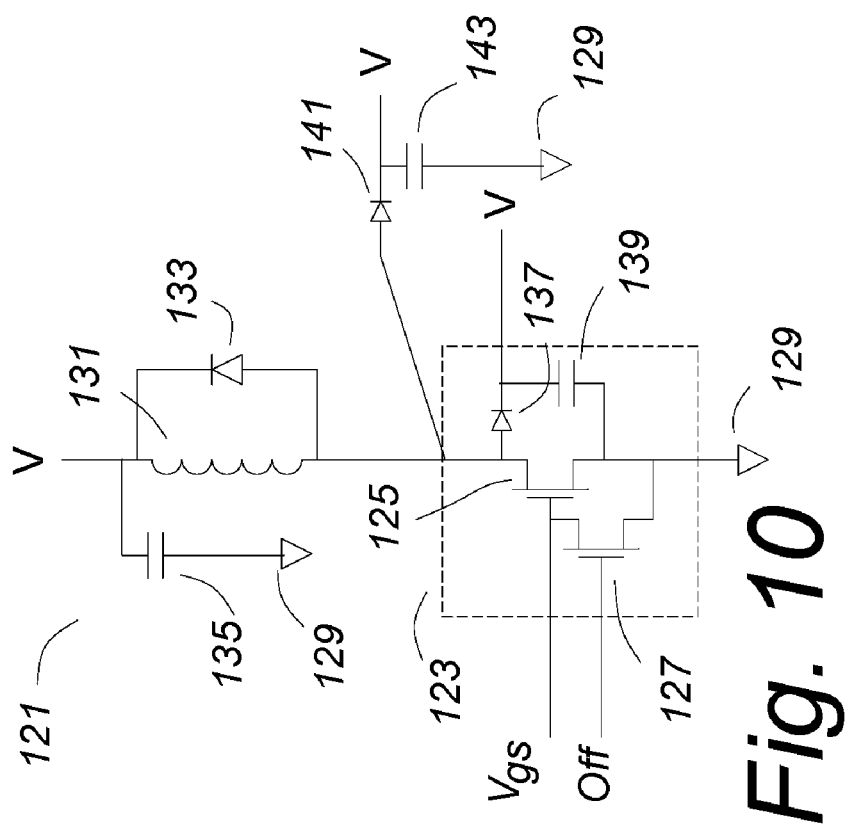
FIG. 10 shows a MOSFET with a local clamp on the MOSFET die, a local clamp on the MOSFET package and a capacitor proximate to the inductive load. Ground and power planes are assumed. A second MOSFET is also shown inside the MOSFET package, proximate to the MOSFET die to provide a very low impedance path for the gate current during turn off.

FIG. 10 shows a circuit 121 wherein a first MOSFET 125 may be turned off very quickly by a second MOSFET 127. Both are within a package 123. The circuit 121 shows a clamping diode 133 around an inductor 131 to clamp the inductive kick to the supply voltage V. FIG. 10 also shows the use of a local clamping diode 137 within the package 123 on or proximate to the first MOSFET 125. It is also preferred to put a local clamping diode 141 on the drain lead of the MOSFET package 123. Both of local clamping diodes 137 and 141 supplement the main clamping diode 133 to clamp transients attributable to the package inductance and the circuit inductance to the package leads respectively. Because it is important that the current return for each of the respective clamping diodes have a very low impedance, each is bypassed by a capacitor located very close to it. The capacitor 139 provides a low inductance path within the package 123 for the clamping diode 137. The capacitor 143 provides a low inductance path for the clamping diode 141, and the capacitor 135 provides a low impedance path for the clamping diode 133. The respective returns 129—129 are a ground plane or other very low inductance conducting means. The local capacitors 139 and 143 may be connected to the clamping voltage V through resistors (not shown) to reduce ringing.

The clamping circuits shown in FIG. 10 are but one example. The same technique of using a local internal clamp and an external clamp are useful techniques that can be adapted for different circuits. For example, in a push pull circuit, the clamping voltage should be two times V. In a symmetrical push pull circuit, two capacitors and a diode will be used, as examples, not limitation.

Figure 11:
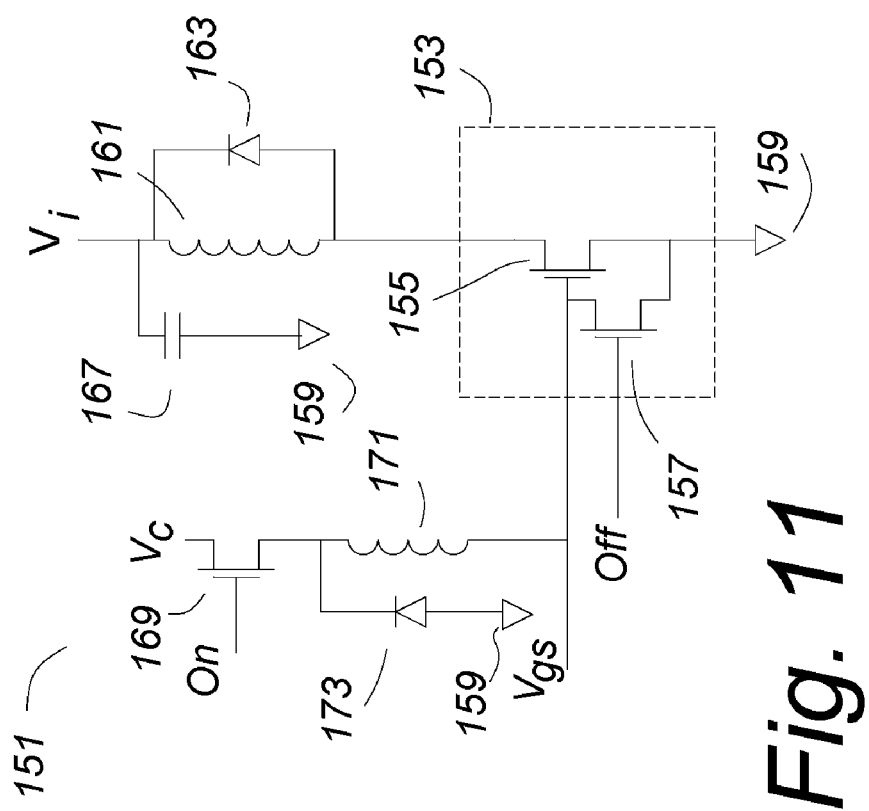

Often, the turn on of a MOSFET is not nearly as critical as the turn off. It is still desirable for it to be quite fast, and FIG. 11 shows a turn on circuit 151 that exploits the components described above for fast turn off. A first MOSFET 155 has a second MOSFET 157 located with it in a common package 153. The second MOSFET 157 can be turned on to turn off the first MOSFET 155. As such, it puts a very low impedance to ground 159 on the gate of the first MOSFET 155. Somewhat in advance of the desired turn on time, a third MOSFET 169 connected between a voltage source $V_C$ and an inductor 159 is turned on, causing a current to build up storing energy in the inductor 159. As long as the second MOSFET 157 is conducting, this current is conducted to ground. When it is desired to turn on the first MOSFET 155, the second MOSFET 157 can be turned off. As it has been optimized for fast switching, this will be very fast. The third MOSFET 169 can then be turned off, but the current will continue to flow through the catch diode 173 until the energy in the inductor is dissipated. Care must be taken not to exceed the voltage rating of the gate of the first MOSFET 155. One skilled in the art of power converters would know how to design suitable protective circuits.

As an additional benefit of this method of turn on, quite often in a power converter the drain voltage will be dropping rapidly in the moments before turn on. This negative dv/dt will cause a fairly large negative current flow, which could charge the gate capacitance to a significant negative potential and result in a much slower total turn on time. Fortunately, the second MOSFET 157 provides a low impedance to ground preventing the gate from charging to a negative voltage.

The parallel capacitance 33 of FIG. 4 can be beneficial to the turn-off of MOSFETs, but if care is not taken, it can increase the loss at turn-on. This is because if there is a voltage on the drain when the MOSFET 3 is turned on, the charge on the drain capacitance as well as the charge on the parallel capacitor 33 will discharge into the MOSFET 3. One application does not have this problem, the 100% duty-cycle push pull transformer circuit. When one side is turned off, and its drain voltage goes high, the transformer action causes the other side to go low, probably even negative. If the other MOSFET is turned on while the voltage is low, zero volt switching is achieved. (Care must be taken not to turn it on too soon, though, before the voltage has dropped, or the capacitance will discharge into the MOSFET).

In many pulse width modulated power converter circuits, however, the quiescent off state has a significant voltage on the MOSFET. In the example of the push pull transformer circuit, it is nominally line voltage. There may be oscillations present, so the actual voltage may be higher (or lower).

Figure 12:
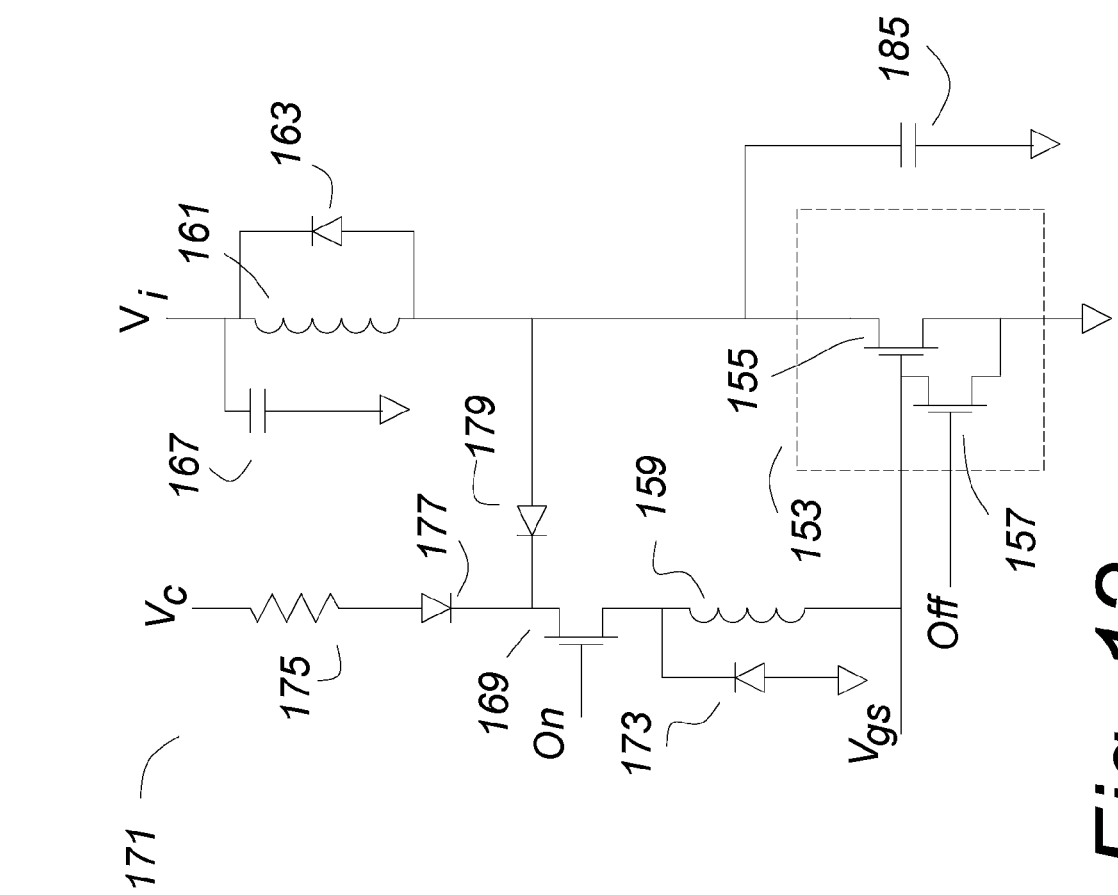

FIG. 12 shows a gate drive suitable for such PWM converters and other circuits where a load (a first inductor 161) is inductive and where there is significant voltage on a first MOSFET 155 during the off state. The significance of the inductive load 161 is that the current will be zero and will not rise appreciably during the time of interest. Since the first MOSFET 155 is off, it is assumed that the second MOSFET 157 is turned on and has a low impedance. To initiate turn-on, a third MOSFET 169 is turned on. This connects the drain of the first MOSFET through a diode 179 to a second inductor 159 which in turn is connected to the gate of the first MOSFET 155 and the drain of the second MOSFET 157. Assuming that the third MOSFET 169 has a low impedance, the current will rise rapidly, determined by the value of the inductor 259 and the drain voltage. This will have the dual effect of reducing the drain voltage and storing energy in the inductor. In a classical L-C circuit, the stored energy in the inductor will be maximum at the time that the capacitor is discharged to zero. Accordingly, when the drain voltage goes to zero, the second MOSFET 157 is turned off quickly, and the stored energy in the inductor 159 is directed to the gate of the first MOSFET 155.

Thus the energy stored on the drain capacitance and any parallel capacitors such as the capacitor 185 can be recovered and used to turn on the first MOSFET 155 with a zero volt turn-on. A diode 173 may be added as a catch diode to keep the voltage from going lower than the source (though the MOSFET body diode would serve this function as well). A blocking diode 179 may be added to prevent the MOSFET from sinking the gate voltage once it is on. Vcc and Rg may be added to ensure that the gate has some drive even if there is insufficient energy on the drain capacitance, and to fix the steady state gate voltage.

FIG. 13 shows a similar gate drive, adapted for a 100% duty cycle push-pull transformer circuit 201. A transformer 221 comprising a core 223, primary windings 225 and 227 and a secondary winding 229 is connected to an input voltage Vi and first and second MOSFETs 205 and 215. Third and fourth MOSFETs 207 and 217 respectively are used to turn off the first and second MOSFETs 205 and 215 by providing a low impedance from their respective gates to their respective sources within respective packages 203 and 213.

A first turn on circuit 209 comprises an inductor 231, a capacitor 233, a resistor 235 and diodes 237 and 239 and interfaces with the drain of the first MOSFET 205 and the gate of the second MOSFET 215. A second turn on circuit 219 comprises an inductor 241, a capacitor 243, a resistor 245 and diodes 247 and 249 and interfaces with the drain of the second MOSFET 215 and the gate of the first MOSFET 205.

To understand the operation of the turn on circuits, consider that the push-pull transformer circuit 201 is operating at 100% duty cycle. The first MOSFET 205 is on, and the second MOSFET 215 is off. To transition to the other state, the first event is that the gate of the third MOSFET 207 is turned on quickly, causing the first MOSFET 205 to turn off. As that happens, the drain voltage of the first MOSFET 205 will rise rapidly. Consider further that the fourth MOSFET 217 continues to be on for a moment. As the drain of the first MOSFET 205 rises, by mutual coupling of the primary windings 225 and 227 of the transformer 223, the drain voltage of the second MOSFET 115 will be falling, and it is desired that the second MOSFET 215 remain off until its drain voltage goes to zero.

Also, as the drain voltage of the first MOSFET 205 is rising, a current will flow through the capacitor 233 and the inductor 231 to the gate of the second MOSFET 215. However, the fourth MOSFET 217 is still on, so the current is bypassed to the source of the second MOSFET 215 and it will remain off. Once the drain voltage of the second MOSFET has reached zero (or its minimum), the fourth MOSFET 217 is turned off quickly. Current will then flow into the gate of the second MOSFET 215, turning it on rapidly. Pull up resistors 235 and 245 to Vc provide a gate drive for the initial turn on, and also stabilize the gate voltage. The diodes 237 and 247 are catch diodes, and prevent the voltage from going negative. The diodes 239 and 249 prevent reverse current flow.

The second turn on circuit 219 works similarly for the other transition.

There may be circuit conditions where there is insufficient stored energy in the windings of the transformer 223 to reduce the voltage on the drain of the MOSFETs to zero. A simple R-C circuit can be used to differentiate the drain voltage, triggering turn on when the derivative of the voltage goes to zero. This will occur either when the drain voltage has gone to zero and the body diode is conducting or if the drain voltage remains static or if the drain voltage dips toward zero but has insufficient energy to reach zero, beginning an oscillation. The minimum will be sensed by the differentiation circuit, and turn on can be accomplished at the optimum time, that is, at the lowest drain voltage. Such circuits would be familiar to one skilled in the art of analog circuit design.

Figure 14:
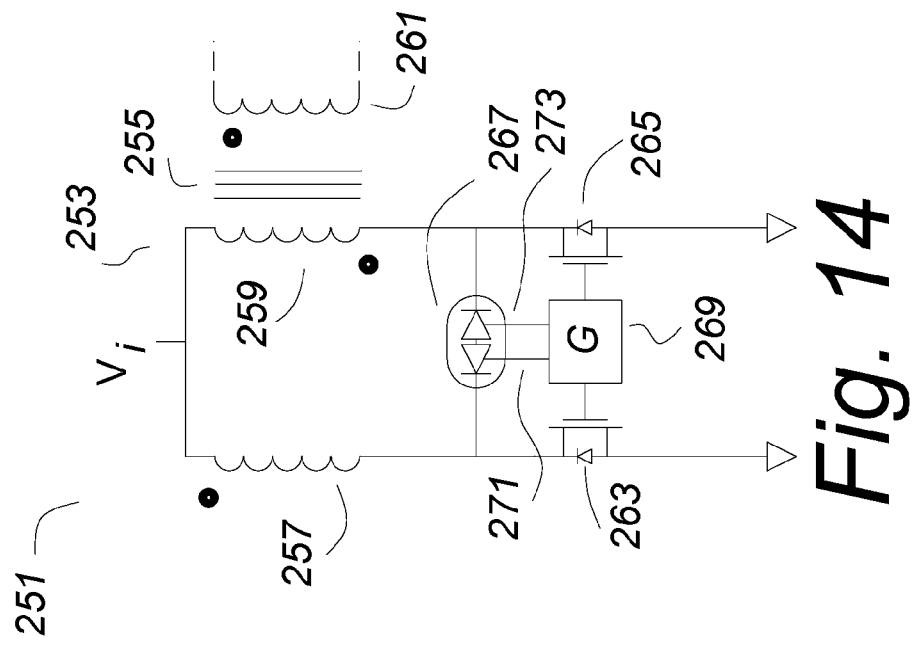
FIG. 14 shows a push pull primary circuit with a bilateral controlled rectifier clamp.

The push-pull transformer circuit 251 of FIG. 14 shows a modification for pulse width modulated (PWM) operation. A transformer 253 comprising a core 255, primary windings 257 and 259 and a secondary winding 261 is connected to a voltage source Vi and first and second MOSFETs 263 and 265. A bilateral controlled rectifier 267 is connected from the drain of the first MOSFET 263 to the drain of the second MOSFET 265.

PWM operation implies that there is an off time between successive cycles when both the first and second MOSFETs 263 and 265 are off. Usually, during the off time, the windings of the transformer 253 will be oscillating and the voltages on the respective drains of the first and second MOSFETs will be unpredictable. Further, if the voltages have settled down, the currents in the windings 257 and 259 may have decayed to zero. Accordingly, the turn on circuits 209 and 219 of FIG. 13 could not be used for PWM operation without circuit modifications.

The bilateral controlled rectifier 267 is a possible modification to accomplish that objective. By definition, the bilateral controlled rectifier 267 will conduct as a rectifier in one direction if one of its control inputs 271 or 273 is "on" and in the other direction if the other is "on". In operation, it will be turned on in the appropriate direction to sustain the current that was flowing in the transformer windings 257 and 259 with near zero terminal voltage.

Accordingly, the turn off and turn on cycles of the PWM push pull circuit 251 are as follows. Let us consider the case where the first MOSFET 263 is conducting, near the end of its on cycle. The second MOSFET 265 is off. First, the bilateral controlled rectifier is enabled to conduct as a rectifier from the drain of the first MOSFET 263 to the drain of the second MOSFET 265. However, at this instance, it is reverse biased. Next, the first MOSFET 253 is turned off. As its drain voltage rises, the drain voltage of the second MOSFET 265 will fall. As soon as the bilateral controlled rectifier is forward biased, it will conduct, allowing the current to continue to flow and stabilizing the voltage at approximately equal to the input voltage Vi. The PWM transformer circuit 251 is now in its off time.

At the end of the off time, the bilateral controlled rectifier is turned off. At this time, the current through it is interrupted, and the inductive kick will cause the voltage on the drain of the first MOSFET 263 to rise quickly and the voltage on the drain of the second MOSFET 265 to fall quickly, until its body diode begins to conduct, at which time its drain voltage is clamped near zero.

Referring back to the circuit 201 of FIG. 13, it can be seen that this modification will allow PWM operation. The fourth MOSFET 217 is kept on through the off cycle, then is turned off when the drain voltage of the second MOSFET 215 goes to zero (or its minimum).

FIG. 15 shows a pair of MOSFETs 283 and 285 "back to back". This circuit 281 will function as a bilateral controlled rectifier. FIG. 16 shows an alternate bilateral controlled rectifier 291 comprising two MOSFETs 293 and 295 and two rectifiers 297 and 299. This arrangements avoids conduction through the body diodes. For lower voltage operation, the rectifiers 297 and 299 are preferably Schottky rectifiers.

In the circuits of FIGS. 11 through 14, an inductor and a switching means are in series between a source of voltage and the gate of the MOSFET being switched. Being series components, the order of the components is unimportant, so a recitation in the specification and the claims in a particular order includes other series arrangements. Various auxiliary components such as clamps, snubbers, catch rectifiers, bias resistors or supplies, gate drive logic and so forth may be necessary and would be well understood by one skilled in the art of power converters, but they are not at the heart of the invention and thus may not be recited in the specification and the claims.

Figure 17:
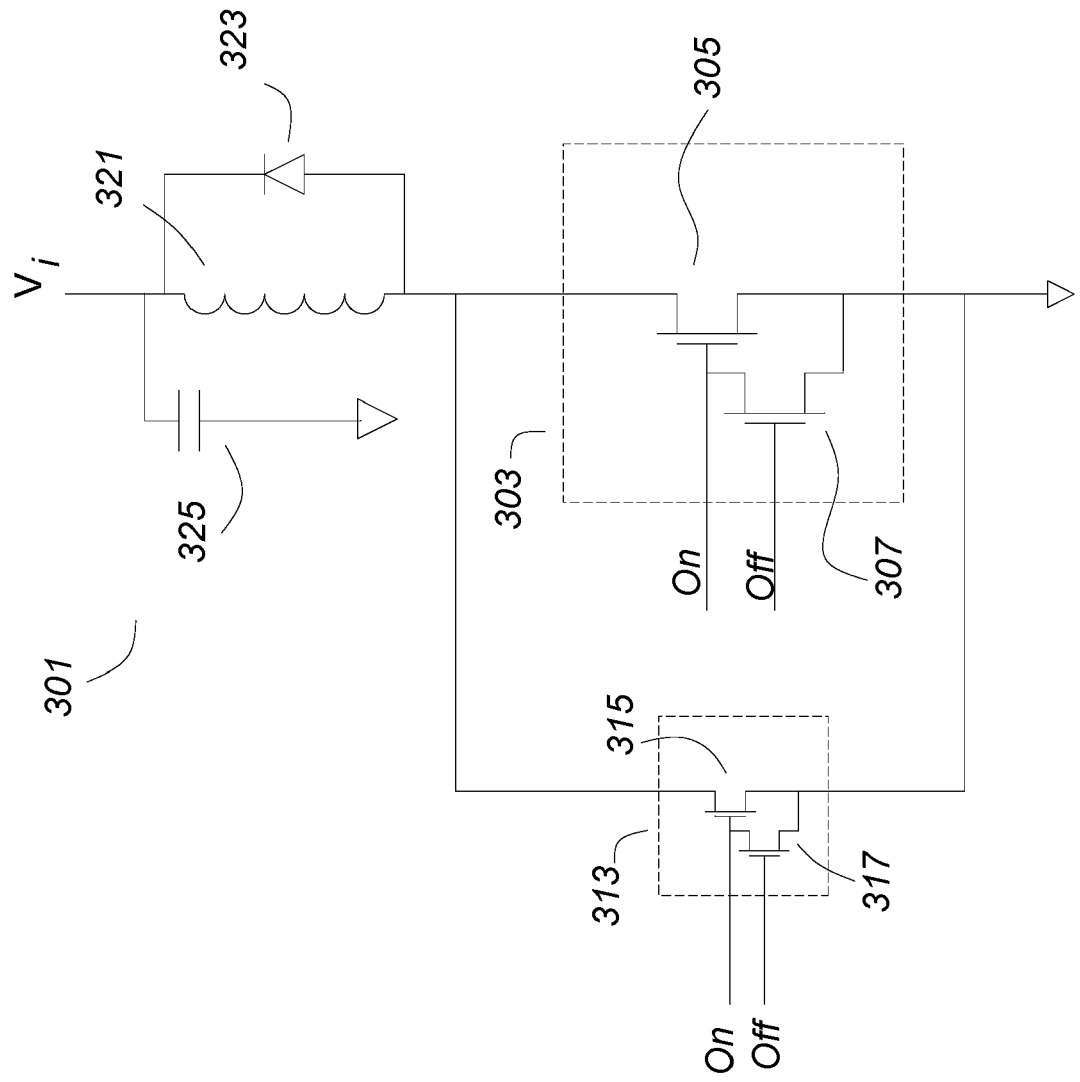
FIG. 17 shows a driver circuit that can be turned off sequentially to reduce the consequences of the Miller effect.

FIG. 17 shows another circuit 301 in which the consequences of the Miller effect may be reduced. An inductive load 321 is powered by an input voltage Vi and controlled by first and second MOSFETs 305 and 315. In accordance with the teachings of this invention, the respective gates of the first and second MOSFETs 305 and 315 may be pulled low rapidly by respective third and fourth MOSFETs 307 and 317. A diode 323 clamps the voltage on the inductive load 321, and a capacitor 325 provides a low impedance ac path to ground.

The first and second MOSFETs 305 and 315 may be in different packages 303 and 313 as shown, or they may be in a common package or even on a common die. They may be of different size, for example, not a limitation, consider that the first MOSFET 305 may be 19 times the size of the second MOSFET 315, where "size" is defined by their relative conductivity while turned on fully. This will approximate their physical area as well, and will also approximate their relative parasitic capacitances. The MOSFETs may be separate devices, as shown. Alternatively, a portion of the cells of a single MOSFET may be divided out and controlled separately. In our example, that could be 5 percent of the cells, as an illustration, not a limitation.

Consider now the sequence for turning off the current in the inductive load 321. First the first MOSFET 305 would be turned off by turning on the third MOSFET 307. Its gate voltage would fall, passing through the turn off threshold and approaching zero. The second MOSFET 315 would remain on momentarily, and would conduct the load current. Having 5 percent of the conductivity, the common drain voltage would rise somewhat, but it would be clamped at a fairly low voltage, perhaps a few volts. With very little rise in the drain voltage, there is no significant Miller current at this time in the switching cycle.

Once the gate voltage of the first MOSFET 305 was firmly below the cutoff threshold, the second MOSFET 315 would be turned off. At this time, the common drain voltage would begin to rise, and there would be a Miller current into the gate of both MOSFETs 305 and 315, dividing as their respective drain-gate capacitances. Preferably, the on impedance of the third MOSFET 307 would be sufficiently low so that the Miller current in the first MOSFET 305 would not turn the first MOSFET back on. Further, the impedance of the fourth MOSFET 317 is preferably sufficiently low that its gate current is larger than its Miller current so that there will be no Miller shelf and it will turn off very quickly as taught above by this invention.

Because the Miller current will divide as the relative drain to gate capacitances of the first and second MOSFETs 305 and 315, it can be seen that the teachings of this invention can be accomplished with a smaller gate drive using the sequential turn off than if one more powerful gate drive were used. Because the second MOSFET 315 carries the entire load very briefly, its power dissipation would be only slightly more, proportionately.

U.S. Pat. No. 6,127,861 (Lee) shows a similar circuit arrangement, but the switching is much different that that of this invention. Most importantly, the parallel MOSFETs are used mutually exclusively, one if the duty cycle is detected to be short, and the other if the duty cycle is detected to be longer. Nowhere is it suggested to use the parallel MOSFETs sequentially during the same turn off time, nor is there any disclosure or suggestion that would inspire one skilled in the art of power converters to use the circuit sequentially in the same turn off time as taught by this invention.

The figures and graphs of are simplified to show the heart of the invention. Practical circuits will have additional components which would be well known to one skilled in the art of power conversion, such as, as illustrations, not limitations, gate drive logic and drivers, snubbers, transformers and their secondary circuits, control and feed back circuits, timing oscillators, filter circuits and so forth to make practical circuits.

What is claimed is:

1. A MOSFET and a gate drive circuit adapted for very fast turn off for reduced crossover power losses, comprising
   a first MOSFET having a gate, a drain and a source for switching a load current equal to $i_d$;
   at least a second MOSFET having a gate, a drain and a source for turning off the first MOSFET;
   the source of the first MOSFET and the source of the at least a second MOSFET being connected together as a source connection;
   the gate of the first MOSFET and the drain of the at least a second MOSFET being connected together as a drain-gate connection;
   the gate of the first MOSFET being characterized by having a very low gate resistance;
   the on resistance of the at least a second MOSFET being characterized by having a very low channel resistance;
   the source connection being characterized by having a very low impedance; and
   the drain-gate connection being characterized by having a very low impedance, so that
   when the at least a second MOSFET initially is turned on, and the first MOSFET begins to turn off, a gate current $i_g$ will flow from the gate of the first MOSFET to the source of the first MOSFET through the at least a second MOSFET,
   and the gate current $i_g$ is larger than the load current $i_d$.

2. The MOSFET and gate drive circuit of claim 1 wherein the at least a second MOSFET is a large number of second MOSFETs;
   the source connection is a large number of source connections, and
   the drain-gate connection is a large number of drain-gate connections.

3. The MOSFET and gate drive circuit of claim 2 wherein the large number of second MOSFETs are integrated into the first MOSFET die.

4. The MOSFET and gate drive circuit of claim 2 wherein the first MOSFET comprises a first MOSFET die and the large number of second MOSFETs comprise a second MOSFET die, and the at least a second MOSFET die is immediately proximate to the first MOSFET die.

5. The MOSFET and gate drive circuit of claim 4 wherein the second MOSFET die is mounted upon the first MOSFET die.

6. The MOSFET and gate drive circuit of claim 2 wherein the large number of second MOSFETs are mounted upon the first MOSFET and connected thereto as a hybrid circuit.

7. The MOSFET and gate drive circuit of claim 1 further comprising a local clamp circuit comprising a diode and a capacitor immediate proximate to the first MOSFET.

8. The MOSFET and gate drive circuit of claim 1 further comprising a gate turn on circuit comprising at least a third MOSFET connected to a source of voltage and an inductor connected to the at least a third MOSFET and to the gate of the first MOSFET.

9. The MOSFET and gate drive circuit of claim 8 whore the source of voltage is the drain of the first MOSFET.

10. The MOSFET and gate drive circuit of claim 8 wherein the first MOSFET is one of a pair of MOSFETs in a push-pull circuit and the source of voltage is the drain of a second MOSFET of the pair of MOSFETs.

11. The MOSFET and gate drive circuit of claim 9 further comprising a bilateral controlled rectifier connected between the drain of the first MOSFET and the drain of the second MOSFET of the pair of MOSFETs.

12. A method for turning off very quickly to reduce crossover power loss a first MOSFET that has a drain, a gate and a source and that is conducting a load current equal to $i_d$, the method comprising
fabricating the first MOSFET so as to have a gate threshold cutoff voltage of $V_{th}$ and a very low gate resistance,
fabricating at least a second MOSFET having a drain, a gate and a source so that the on resistance of the at least a second MOSFET is very low;
connecting the source of the first MOSFET to the source of the at least a second MOSFET with a source to source connection having a very low resistance;
connecting the gate of the first MOSFET to the drain of the at least a second MOSFET with a gate to drain connection having a very low resistance;
such that the very low gate resistance in the first MOSFET plus the very low on resistance of the at least a second MOSFET plus the very low resistance or the source to source connection plus the very low resistance of the gate to drain connection is less than the ratio of $V_{th}$ to $I_d$,
turning on the at least a second MOSFET so that a current $i_g$ will flow from the gate of the first MOSFET to the source of the first MOSFET through the at least a second MOSFET, and
and the gate current $i_g$ is larger than the load current $i_d$.

13. A method for sequentially turning off a MOSFET and a gate drive circuit adapted for sequential turn off for reduced crossover power losses, the gate drive circuit comprising a first MOSFET comprising a first MOSFET having a gate, a drain and a source;
a second MOSFET having a gate, a drain and a source;
the source of the first MOSFET being connected to the source of the second MOSFET
the drain of the first MOSFET being connected to the drain of the second MOSFET;
so that the first MOSFET and the second MOSFET are in parallel and together switch a load current equal to $i_d$;
the first MOSFET being larger than the second MOSFET,
at least a third MOSFET having a gate, a drain and a source for turning off the first MOSFET;
the gate of the first MOSFET and the drain of the at least a third MOSFET being connected together;
the source of the first MOSFET and the source of the at least a third MOSFET being connected together;
at least a fourth MOSFET having a gate, a drain and a source for turning off the second MOSFET;
the gate of the second MOSFET and the drain of the at least a fourth MOSFET being connected together;
the source of the second MOSFET and the source of the at least a fourth MOSFET being connected together;
the gate of the first MOSFET being characterized by having a very low gate resistance;
the on resistance of the at least a third MOSFET being characterized by having a very low channel resistance;
the gate of the second MOSFET being characterized by having a very low gate resistance;
the on resistance of the at least a fourth MOSFET being characterized by having a very low channel resistance;
the method for sequentially turning off a MOSFET and a gate drive circuit comprising
first turning on the third MOSFET so as to turn off the first MOSFET while the second MOSFET remains conducting to limit the rise of the voltage on the common drain connection of the first MOSFET and the second MOSFET so that the gate voltage of the first MOSFET is reduced to a voltage that is below the cutoff threshold gate voltage of the first MOSFET; and
then, when the gate voltage of the first MOSFET is reduced to a voltage that is below the cutoff threshold voltage of the first MOSFET, turning on the fourth MOSFET so as to turn off the second MOSFET and interrupt the load current.

* * * * *